US008729527B2

(12) United States Patent
Iguchi et al.

(10) Patent No.: US 8,729,527 B2
(45) Date of Patent: May 20, 2014

(54) LIGHT-RECEIVING ELEMENT, LIGHT-RECEIVING ELEMENT ARRAY, METHOD FOR MANUFACTURING LIGHT-RECEIVING ELEMENT AND METHOD FOR MANUFACTURING LIGHT-RECEIVING ELEMENT ARRAY

(75) Inventors: Yasuhiro Iguchi, Osaki (JP); Kohei Miura, Osaka (JP); Hiroshi Inada, Osaka (JP); Youichi Nagai, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 190 days.

(21) Appl. No.: 13/451,031

(22) Filed: Apr. 19, 2012

(65) Prior Publication Data
US 2012/0223290 A1 Sep. 6, 2012

Related U.S. Application Data

(63) Continuation of application No. 13/061,367, filed as application No. PCT/JP2009/063248 on Jul. 24, 2009, now Pat. No. 8,188,559.

(30) Foreign Application Priority Data

Dec. 26, 2008 (JP) ................. 2008-334907

(51) Int. Cl.
*H01L 31/00* (2006.01)
*H01L 21/00* (2006.01)
(52) U.S. Cl.
USPC .............. 257/21; 257/E31.033; 257/E31.059; 458/93
(58) Field of Classification Search
CPC .............. B82Y 20/00; H01L 27/14683; H01L 31/03046; H01L 31/102; H01L 21/1844
USPC .......... 257/21.53, 184, 615, E31.033, 257/E31.059; 438/87, 57, 93
See application file for complete search history.

(56) References Cited

U.S. PATENT DOCUMENTS

| 2007/0096236 A1 | 5/2007 | Yagyu et al. |
| 2008/0142714 A1 | 6/2008 | Nagai et al. |
| 2010/0051905 A1 | 3/2010 | Iguchi et al. |

FOREIGN PATENT DOCUMENTS

| JP | 63-001079 | 1/1988 |
| JP | 01-214069 | 8/1989 |

(Continued)

OTHER PUBLICATIONS

Japanese Patent Office, Official Communication in Japanese Patent Application No. 2012-049626 (Oct. 1, 2013) and partial English translation.

(Continued)

*Primary Examiner* — Nikolay Yushin
(74) *Attorney, Agent, or Firm* — Fish & Richardson P.C.

(57) ABSTRACT

A light-receiving element includes a group III-V compound semiconductor stacked structure that includes an absorption layer having a pn-junction therein. The stacked structure is formed on a group III-V compound semiconductor substrate. The absorption layer has a multiquantum well structure composed of group III-V compound semiconductors, and the pn-junction is formed by selectively diffusing an impurity element into the absorption layer. A diffusion concentration distribution control layer composed of a III-V group semiconductor is disposed in contact with the absorption layer on a side of the absorption layer opposite the side adjacent to the group III-V compound semiconductor substrate. The bandgap energy of the diffusion concentration distribution control layer is smaller than that of the group III-V compound semiconductor substrate. The concentration of the impurity element selectively diffused in the diffusion concentration distribution control layer is $5\times10^{16}/cm^3$ or less toward the absorption layer.

17 Claims, 14 Drawing Sheets

(56) References Cited

FOREIGN PATENT DOCUMENTS

| | | |
|---|---|---|
| JP | 03-038887 | 2/1991 |
| JP | 05-041564 | 2/1993 |
| JP | 05-047692 | 2/1993 |
| JP | 05-160426 | 6/1993 |
| JP | 05-160429 | 6/1993 |
| JP | 07-106621 | 4/1995 |
| JP | 09-219563 | 8/1997 |
| JP | 09-283786 | 10/1997 |
| JP | 2001-144278 | 5/2001 |
| JP | 2006-270060 | 10/2006 |
| JP | 2007-080920 | 3/2007 |
| JP | 2007-201432 | 8/2007 |
| JP | 2007-324572 | 12/2007 |
| JP | 2008-153311 | 7/2008 |
| JP | 2008-171885 | 7/2008 |
| JP | 2008-205001 | 9/2008 |
| JP | 2008-270760 | 11/2008 |
| JP | 2008-288293 | 11/2008 |
| WO | 2007/120931 | 10/2007 |
| WO | 2010/029813 | 3/2010 |
| WO | 2010/032553 | 3/2010 |
| WO | 2010/073769 | 7/2010 |
| WO | 2010/073770 | 7/2010 |

OTHER PUBLICATIONS

Yamamoto et al., "Optical properties of $GaAs_{0.5}Sb_{0.5}$ and $In_{0.53}Ga_{0.47}As/GaAs_{0.5}Sb_{0.5}$ type II single hetero-structures lattice-matched to InP substrates grown by molecular beam epitaxy," J. of Crystal Growth, Elsevier 201/202, pp. 872-876 (1999).

Sidhu et al., "A Long-Wavelength Photodiode on InP Using Lattice Matched GaInAs—GaAsSb Type-II Quantum Wells," IEEE Photonics Tech. Letters 17(12):2715-2717 (2005).

Murakami et al., "$In_XGa_{1-X}As/InAs_YP_{1-y}$ detector for near infrared (1.2.6 μm)," Conference Proceedings of Indium Phosphide and Related Materials, pp. 528-531 (1995).

Japanese Patent Office, official communication in Japanese Patent Application No. 2011-125375 dated Jun. 4, 2013 (with English translation).

Japanese Patent Office, official communication in Japanese Patent Application No. 2012-049626 dated Jun. 4, 2013 (with English translation).

ured out for the purpose of communications, biological examinations, imaging at night etc. Among these studies, a study that has been particularly focused on is a study on how group III-V compound semiconductor crystal layers having smaller bandgap energy and a plurality of light-receiving element that are arranged on these crystal layers to constitute a light-receiving unit can be formed on an InP substrate with good crystal qualities.
LIGHT-RECEIVING ELEMENT, LIGHT-RECEIVING ELEMENT ARRAY, METHOD FOR MANUFACTURING LIGHT-RECEIVING ELEMENT AND METHOD FOR MANUFACTURING LIGHT-RECEIVING ELEMENT ARRAY

RELATED APPLICATIONS

This application is a continuation of U.S. Ser. No. 13/061,367, filed on Feb. 28, 2011, which in turn is a §371 of PCT/JP2009/063248 filed on Jul. 24, 2009, which claims priority to Japanese Patent application number 2008-334907, filed on Dec. 26, 2008. The previous applications are incorporated herein by reference.

TECHNICAL FIELD

The present invention relates to a light-receiving element, a light-receiving element array, and methods for producing the same. More specifically, the present invention relates to a light-receiving element, having sensitivity in the near-infrared region and capable of being used in optical communications, imaging devices, sensors, and the like, a light-receiving element array, and methods for producing the same.

BACKGROUND ART

Group III-V compound semiconductors using an InP substrate have a bandgap energy corresponding to the near-infrared region, and thus many studies on group III-V compound semiconductors have been carried out for the purpose of communications, biological examinations, imaging at night etc. Among these studies, a study that has been particularly focused on is a study on how group III-V compound semiconductor crystal layers having smaller bandgap energy and a plurality of light-receiving element that are arranged on these crystal layers to constitute a light-receiving unit can be formed on an InP substrate with good crystal qualities.

For example, results of the experimental production of a light-receiving element in which a sensitivity region is shifted to the long-wavelength side by using $In_{0.82}Ga_{0.18}As$ as an absorption layer have been published (Non-Patent Document 1). In $In_{0.82}Ga_{0.18}As$, the bandgap is narrowed (the lattice constant is increased) by decreasing the proportion of gallium (Ga) and increasing the proportion of indium (In) in group III. When the proportion of In is increased as described above, the lattice constant of InGaAs increases, and a problem of an increase in lattice mismatch with an InP substrate occurs. In the above light-receiving element, this problem is tried to be solved by providing 12 to 20 InAsP graded layers, in which a proportion (As/P) is increased stepwise toward the absorption layer, between the InP substrate and the high-In-proportion InGaAs absorption layer. The increase in the lattice mismatch causes an increase in the lattice defect density, and inevitably results in an increase in the dark current. By interposing the above-mentioned graded buffer layers, the dark current is decreased to 20 to 35 μA. However, this current value is a value three orders higher than the dark current of a photodiode for optical communications, the photodiode including an InGaAs absorption layer. In addition, epitaxially growing a plurality of graded layers is not easy and increases the production cost.

In addition, a quaternary group III-V compound semiconductor composed of GaInNAs in which nitrogen (N) is further added to the group V element in InGaAs has been proposed (Patent Document 1). This quaternary group III-V compound semiconductor uses a function of narrowing the bandgap due to the addition of nitrogen. However, it is technically very difficult to grow GaInNAs crystals. In particular, in order to have sensitivity up to a wavelength of 3 μm and to achieve a lattice match with an InP substrate, it is necessary to increase the amount of nitrogen to about 10% (atomic percent in group V elements). However, it is very difficult to obtain a good crystal quality in a nitrogen amount of about 10%. In addition, in order to realize high sensitivity of a light-receiving element, it is necessary to increase the thickness of the GaInNAs layer containing a high concentration of nitrogen to 2 μm or more. However, it is more difficult to grow the nitrogen-containing crystal layer having such a large thickness with a good crystal quality.

In addition, results of a fabrication of a photodiode has been reported in which the cutoff wavelength is controlled to be 2.39 μm by forming a pn-junction with a p-type or n-type epitaxial layer using a type-II quantum well structure composed of InGaAs—GaAsSb (Non-Patent Document 2). This document describes that strain compensation is necessary in order to further shift the cutoff wavelength to the long-wavelength side. Thus, a photodetector with a cutoff wavelength of 2 to 5 μm having a strain-compensation quantum well structure composed of InGaAs—GaAsSb is proposed in this document.

A plurality of light-receiving elements is two-dimensionally or one-dimensionally arranged and is used as an imaging device or the like. However, unless the respective light-receiving elements are reliably separated from each other, a dark current, crosstalk, and the like are generated, and sharp images cannot be obtained. Photodiodes include a pn-junction. In the above-described photodiode, this pn-junction is formed by epitaxially growing, on a p-type semiconductor layer or an n-type semiconductor layer, a semiconductor layer having a polarity opposite to that of the semiconductor layer disposed thereunder. In this case, in order to separate the pn-junction that is widely formed as a plane into pn-junctions of respective light-receiving element, trenches for separating into respective light-receiving elements are provided. Such a trench is called an element separation trench and is formed by forming a planer pn-junction, and then performing mesa etching. In the formation of the element separation trenches of photodiodes for the near-infrared region, the photodiodes including an InP substrate, wet etching can be stopped at boundaries of respective layers by using an etchant having selectivity with respect to InP and InGaAs (Patent Document 2).

In the above wet etching method, however, it is difficult to control the shapes of respective light-receiving elements to be separated from each other with a high accuracy. For example, a trapezoidal taper may be formed in the longitudinal cross section of respective light-receiving elements, irregularities (recesses and protrusions) may be formed on a side face of a laminate depending on the type of semiconductor layer, or etchants may not sequentially intrude between adjacent light-receiving elements, and consequently, the formation of the trenches may be stopped in a halfway position and complete trenches may not be formed. It is very difficult to eliminate such incompleteness of element separation trenches. On the other hand, when a dry etching method is employed, damage occurs during etching, and it is difficult to stably produce photodiodes having a low dark current. Consequently, the yield decreases, thereby increasing the production cost.

As for the formation of an arrangement structure, i.e., the formation of an array, of a plurality of the above-mentioned light-receiving elements, except for Non-Patent Document 1, the pn-junction of the light-receiving elements proposed in the above-cited documents is formed between a p-type epitaxial layer and an n-type epitaxial layer, and the one-dimensional or two-dimensional arrangement of the light-receiving elements is performed by forming element separation trenches. Accordingly, the above-described problems in the formation of the element separation trenches occur.

[Non-Patent Document 1] T. Murakami, H. Takahashi, M. Nakayama, Y. Miura, K. Takemoto, D. Hara, "$In_xGa_{1-x}As/InAs_yP_{1-y}$ detector for near infrared (1 to 2.6 μm)", Conference Proceedings of Indium Phosphide and Related Materials 1995, May, Sapporo, pp. 528-531

[Non-Patent Document 2] R. Sidhu, "A Long-Wavelength Photodiode on InP Using Lattice-Matched GaInAs—GaAsSb Type-II Quantum Wells, IEEE Photonics Technology Letters, Vol. 17, No. 12 (2005), pp. 2715-2717

[Patent Document 1] Japanese Unexamined Patent Application Publication No. 9-219563

[Patent Document 2] Japanese Unexamined Patent Application Publication No. 2001-144278

DISCLOSURE OF INVENTION

Problems to be Solved by the Invention

As described above, there are some candidates for a light-receiving element and a light-receiving element array that have sensitivity at the long-wavelength side of the near-infrared region. However, there are many difficult problems to be overcome in view of practical use, such as a low crystal quality, a high dark current, and a difficult production process, and therefore, such a light-receiving element and a light-receiving element array have been under development. Under these circumstances, an object of the present invention is to provide a light-receiving element and which has sensitivity in the near-infrared region and in which a good crystal quality is easily obtained, a one-dimensional or two-dimensional array of the light-receiving element is easily formed with a high accuracy, and a dark current can be reduced; a light-receiving element array in which the light-receiving elements are arranged; and methods for producing the same.

Means for Solving the Problems

A light-receiving element of the present invention is a light-receiving element having a group III-V compound semiconductor stacked structure including an absorption layer having a pn-junction therein. The group III-V compound semiconductor stacked structure is formed on a group III-V compound semiconductor substrate. In this light-receiving element, the absorption layer has a multiquantum well structure composed of group III-V compound semiconductors, the pn-junction is formed by selectively diffusing an impurity element into the absorption layer, a diffusion concentration distribution control layer composed of III-V group semiconductor is disposed in contact with the absorption layer on a side of the absorption layer opposite the side adjacent to the group III-V compound semiconductor substrate, the bandgap energy of the diffusion concentration distribution control layer is smaller than that of the group III-V compound semiconductor substrate, the concentration of the impurity element selectively diffused in the diffusion concentration distribution control layer is decreased to be $5 \times 10^{16}/cm^3$ or less toward the absorption layer, and an InP window layer is provided on the diffusion concentration distribution control layer.

According to the above configuration, by lowering the concentration of the impurity element to be $5 \times 10^{16}$ $cm^{-3}$ or less, a multiquantum well structure having a bandgap energy corresponding to the near-infrared region can be formed without breaking of the multiquantum well structure, that is, without impairing the crystal quality. Furthermore, the impurity for forming the pn-junction of the light-receiving element is selectively diffused, that is, the impurity is introduced into the inside of the peripheral portion of the light-receiving element by diffusion so that the diffusion in the peripheral portion is two-dimensionally limited. Thus, the impurity is introduced so that the light-receiving elements are separated from each other. Accordingly, each of the light-receiving elements can be formed with a high accuracy, and element separation trenches need not be provided. Thus, a light-receiving element having a low dark current can be formed. Note that the above pn-junction should be broadly interpreted as follows. In the absorption layer, when a region on a surface side opposite a surface from which the impurity element is introduced by selective diffusion is an impurity region (also referred to as "i region") in which the impurity concentration is low enough for the impurity region to be considered as an intrinsic semiconductor, a junction formed between this i-region and the impurity region formed by the selective diffusion is also included in the pn-junction. That is, the pn-junction mentioned above may be a pi-junction, an ni-junction, or the like. Furthermore, the pn-junction also includes the case where the p concentration in the pi-junction or the n concentration in the ni-junction is very low.

The group III-V compound semiconductor stacked structure is formed on a group III-V compound semiconductor substrate, and includes a diffusion concentration distribution control layer composed of a group III-V compound semiconductor and disposed in contact with a surface of the absorption layer, the surface opposite the substrate. The bandgap energy of the diffusion concentration distribution control layer is preferably smaller than the bandgap energy of the group III-V compound semiconductor substrate. In this case, even when the concentration of the impurity element in a thickness range at the absorption layer side of the diffusion concentration distribution control layer is decreased, because of the small bandgap energy, the electrical resistance can be lower than that in the case where a material having a bandgap energy of a group III-V compound semiconductor substrate is used.

Here, more specific characteristics and the reason for the characteristics of the diffusion concentration distribution control layer having a bandgap energy smaller than the bandgap energy of the substrate are as follows:

(1) When an absorption layer for the near-infrared region is formed using group III-V compound semiconductors, a bandgap energy larger than the bandgap energy of the absorption layer is used for a window layer in some cases. In such a case, the same material as the semiconductor substrate is often used as the window layer in consideration of a lattice matching property etc. The bandgap energy corresponding to the cutoff wavelength in the near-infrared region is 0.7 to 0.8 eV. It is assumed that the bandgap energy of the diffusion concentration distribution control layer is smaller than the bandgap energy of the window layer and larger than the bandgap energy of the absorption layer. This is because, if the bandgap energy of the diffusion concentration distribution control layer overlaps with or is too close to the bandgap energy of the absorption layer and a structure in which the top surface of an epitaxial layer functions as an incident surface is adopted, the diffusion concentration distribution control layer absorbs light that should be absorbed by the absorption layer, thereby decreasing sensitivity of the absorption layer.

(2) By using a material having a bandgap energy smaller than a large bandgap energy of a material that is usually used as a window layer, even when the impurity concentration is reduced, it is possible to decrease the degree of an increase in the electrical resistance or the degree of a decrease in the electrical conductivity. As a result, as described above, a decrease in a response time can be suppressed in a voltage-applied state.

In the diffusion concentration distribution control layer, the concentration of the impurity element may decrease to $5 \times 10^{16}/cm^3$ or less toward the absorption layer side. And the concentration of the impurity element may decrease from a high concentration of about $1 \times 10^{18}/cm^3$ or more on the surface side opposite a surface contacting the absorption layer. In this case, a good crystal quality of the multiquantum well structure can be ensured while reducing the interface resistance of an electrode disposed on the top surface side or allowing an ohmic contact to be formed. The problem of an increase in the electrical resistance or the decrease in the electrical conductivity due to a low impurity concentration in a portion in the diffusion concentration distribution control layer can be reduced by the bandgap energy smaller than the bandgap energy corresponding to that of InP.

A pile-up of selectively diffused impurity element may be present at the boundary between the diffusion concentration distribution control layer and the absorption layer.

The distribution of high impurity element concentration due to the pile-up decreases precipitously with a skirt shape in the absorption layer. For this reason, in the case that the concentration of the opposite conductivity-type carrier is relatively high in spite of non-doping, the pn-junction may be surely formed in the absorption layer, and positioned near the upper surface of the absorption layer. As a result, the depletion layer may be formed throughout the whole depth range of the absorption layer, and the sensitivity may be increased. In addition, as the pile-up does not quit enter within the diffusion concentration distribution control layer and decreases precipitously within the absorption layer, the influence to the absorption layer is small. For this reason, the limitation of the concentration of the impurity element ($5 \times 10^{16}/cm^3$ or less) is not obviously applied to the concentration of the piled up impurity in accordance with the drift of this invention. But even if it applied, the peak concentration of the pile-up is usually $5 \times 10^{16}/cm^3$ or less, and it is satisfied with the above concentration limitation ($5 \times 10^{16}/cm^3$ or less).

The multiquantum well structure may be a type II quantum well structure. In this case, a light-receiving element having sensitivity at the long-wavelength side of the near-infrared region may be easily realized by selecting an appropriate two group III-V compound semiconductor materials.

The group III-V compound semiconductor stacked structure may be formed on an InP substrate, the absorption layer may have an InGaAs/GaAsSb multiquantum well structure or a GaInNAs/GaAsSb multiquantum well structure, and the impurity element may be zinc (Zn). In this case, a light-receiving element having a good crystal quality and a low dark current can be easily obtained by using materials and techniques that have been accumulated to date.

The diffusion concentration distribution control layer may be composed of InGaAs. In this case, the diffusion concentration distribution control layer can be formed using a material for which the dependency of the electrical resistance on the impurity concentration is small, the material having an electrical resistance which does not significantly increase even at a low impurity concentration. Accordingly, in order to prevent a region having a high impurity concentration from being formed in the absorption layer having a quantum well structure, it is possible to prevent an increase in the electrical resistance on the lower side of the diffusion concentration distribution control layer while the impurity concentration which is high at the upper side, i.e., the diffusion introduction side is decreased toward the lower side, i.e., the absorption layer side in the diffusion concentration distribution control layer. As a result, a light-receiving element having a quantum well structure with a good crystal quality can be obtained without decreasing responsiveness. Note that the bandgap energy of InGaAs is 0.75 eV.

An InP window layer may be provided on the diffusion concentration distribution control layer, and there may be no pile-up (accumulation) of Sb at the boundary between the diffusion concentration distribution control layer and the InP window layer. In this case, the diffusion concentration distribution control layer and the window layer that have flat surfaces are obtained, and an increase in the dark current can be prevented. Furthermore, it is possible to prevent the omission of Sb from the multiquantum well structure composed of InGaAs/GaAsSb or the like and forming the absorption layer, and to obtain the absorption layer having a good crystal quality. Furthermore, unexpected troubles due to an Sb-rich layer can be eliminated.

An InP window layer may be provided on the diffusion concentration distribution control layer, and the Sb concentration may be $1 \times 10^{18}/cm^3$ or less in the diffusion concentration distribution control layer and the InP window layer. Specifically, any position of the diffusion concentration distribution control layer and the InP window layer may not exceed an Sb concentration of $1 \times 10^{18}/cm^3$. In this case, the same function, for example, the prevention of an increase in the dark current, as that in the above case where there is no pile-up (accumulation) of Sb can be achieved.

An InP window layer may be provided on the diffusion concentration distribution control layer, and a heterogeneous component pile-up layer (accumulation layer) in which at least one of oxygen (O), carbon (C), hydrogen (H), and silicon (Si) is piled up (accumulated) may be present at the boundary between the diffusion concentration distribution control layer and the InP window layer. In this case, for example, after the diffusion concentration distribution control layer is deposited by a molecular beam epitaxy (MBE) deposition method, the resulting laminate can be taken out from a growth chamber of MBE to the atmosphere and can be moved to a growth chamber used in a deposition method suitable for the deposition of an InP layer in a low temperature range. In general, it is difficult to deposit an InP layer by the MBE method. This is because phosphorus, which has a high hygroscopic property, is attached to inner walls of a growth chamber, and even a very small amount of moisture acts as an impurity that decreases the purity of crystals.

According to the above configuration, the InP window layer can be obtained while keeping a good crystal quality of the absorption layer. The above heterogeneous components are components in the atmosphere, the components being attached to the surface as a result of exposure to the atmosphere. In addition, the formation of the window layer composed of InP does not impair the crystal quality of the semiconductor stacked structure disposed inside. Accordingly, when a structure in which an epitaxial layer is disposed on the incident surface side is adopted, the InP window layer also effectively acts to suppress the dark current while preventing, for example, absorption of near-infrared light at positions closer to the incident side than the absorption layer. Furthermore, techniques for forming a passivation film on a crystal surface of InP have been accumulated and technically established, as compared with techniques used in the case where a passivation film is formed on other crystal surfaces, for example, techniques for forming a passivation film on a surface of InGaAs. Accordingly, a current leakage on a surface can be easily suppressed.

A light-receiving element array of the present invention includes a plurality of any of the above-described light-receiving elements, wherein the light-receiving elements include the semiconductor stacked structure in common, the impurity element is introduced by selective diffusion in the absorption layer for each of the light-receiving elements, and the light-receiving elements are arranged one-dimensionally or two-dimensionally.

According to the above configuration, since the light-receiving elements are formed in individual impurity diffusion regions, element separation trenches need not be provided. Therefore, it is possible to form a light-receiving element array, which is easily formed with a high accuracy, and in which the dark current can be reduced.

A method for producing a light-receiving element of the present invention is a method for producing a light-receiving element having a group III-V compound semiconductor stacked structure that includes an absorption layer having a pn-junction therein. This method includes the steps of forming the absorption layer on an InP substrate so as to have a multiquantum well structure; forming, on the absorption layer, a diffusion concentration distribution control layer having a bandgap energy smaller than the bandgap energy corresponding to that of InP in order to control the concentration of an impurity element in the absorption layer to be low; and selectively diffusing the impurity element into the absorption layer through the diffusion concentration distribution control layer to decrease the concentration of the impurity element in the diffusion concentration distribution control layer to be $5 \times 10^{16}/cm^3$ or less toward the absorption layer side.

According to the method for producing a light-receiving element by lowering the concentration of the impurity element, a multiquantum well structure having a bandgap energy corresponding to the near-infrared region can be formed without breaking of the multiquantum well structure, that is, without impairing the crystal quality. The impurity for forming a pn-junction of the light-receiving element is selectively diffused, that is, the impurity is introduced into the inside of the peripheral portion of the light-receiving element by diffusion so that the diffusion in the peripheral portion is two-dimensionally limited. Thus, the impurity is introduced so as to be separated from the periphery. Accordingly, the light-receiving element can be easily formed with a high accuracy, and thus a light-receiving element having a low dark current can be formed. Furthermore, since the impurity is selectively diffused through the diffusion concentration distribution control layer, the impurity concentration in the multiquantum well structure can be easily controlled to be low. The diffusion concentration distribution control layer has a bandgap energy smaller than the bandgap energy corresponding to that of InP. Accordingly, even if a portion having a low impurity concentration is generated in a thickness range at the absorption layer side of the diffusion concentration distribution control layer, a decrease in the response time in a voltage-applied state can be prevented.

After the absorption layer is formed on the InP substrate so as to have a multiquantum well structure including at least one layer containing Sb and before the diffusion concentration distribution control layer is formed, the stacked structure including the absorption layer may be cooled to 300° C. or lower. In this case, a state in which Sb in the multiquantum well structure is sequentially moved to the surface during deposition is stopped, thereby preventing the roughening of the surface of the diffusion concentration distribution control layer caused by a surface pile-up of Sb. As a result, an increase in the dark current due to a roughened surface can be prevented. The cooling temperature of the stacked structure is preferably 200° C. or lower, and more preferably 100° C.

After the absorption layer is formed on the InP substrate and before the diffusion concentration distribution control layer is formed, the stacked structure may be moved from a growth chamber in which the absorption layer has been formed to a waiting chamber connected to the growth chamber to cool the stacked structure to 300° C. or lower. In this case, an epitaxial laminate having a good crystal quality can be obtained while preventing the surface enrichment of Sb without forming an impurity-attached layer containing an impurity from the atmosphere at the boundary between the diffusion concentration distribution control layer and the absorption layer. The cooling temperature of the stacked structure is preferably 200° C. or lower, and more preferably 100° C.

After the absorption layer is formed on the InP substrate and before the cooling is conducted, the stacked structure may be held at a temperature 10° C. to 50° C. higher than a deposition temperature of the absorption layer for 10 minutes or more and 30 minutes or less, and the cooling or the moving and cooling may then be performed. In this case, Sb accumulated on the surface of the absorption layer by a surfactant effect can be removed by thermal desorption. At a holding time of less than 10 minutes, the effect of the heat treatment is insufficient. At a holding time exceeding 30 minutes, the crystal surface is degraded by heat damage.

The absorption layer and the diffusion concentration distribution control layer may be deposited on the InP substrate at 550° C. or lower by a molecular beam epitaxy (MBE) method, and an InP window layer may then be deposited at 550° C. or lower by an all-metalorganic vapor phase epitaxy (all-MOVPE) method on the diffusion concentration distribution control layer. Herein, the term "all-MOVPE method" refers to an MOVPE method in which organic materials are used as both a group III material and a group V material, that is, an organic phosphorus material tertiarybutylphosphine (TBP) is used as a phosphorus source of InP. A usual MOVPE method also includes a method in which phosphine ($PH_3$) is used as the phosphorus source. However, the thermal decomposition temperature of $PH_3$ is high, and it is difficult to grow InP at a low temperature of 550° C. or lower.

Advantages of the above production method are two points below.

(1) In the MBE method, a multiquantum well structure including several hundreds of pairs can be easily obtained by alternately opening and closing shutters disposed between a substrate for deposition and a plurality of crucibles while forming interfaces at which the composition drastically changes. Thus, the MBE method is a deposition method that is particularly suitable for forming a multiquantum well structure. However, it is difficult to deposit high-purity InP by the MBE method. This is because phosphorus, which has a high hygroscopic property, is attached to inner walls of a growth chamber, and even a very small amount of moisture acts as an impurity that decreases the purity of crystals.

Also in the all-MOVPE method, during the formation of a phosphorus-containing layer such as InP, phosphorus (P) or a P compound attaches to and is deposited on inner walls of a growth chamber. Phosphorus or such a P compound may react with oxygen in air and ignite. However, in the deposition by the MBE method, it is necessary to open the growth chamber to the atmosphere even when materials are replenished, and it is also necessary to open the growth chamber to the atmosphere when a trivial maintenance is performed. Therefore, phosphorus attached to the inner walls of the growth chamber absorbs moisture in the atmosphere (the cause of (1) above) or react with oxygen and the probability of ignition increases. In contrast, in the all-MOVPE method (similarly to the normal MOVPE method), a growth chamber is not opened to the atmosphere very often. Since materials are allowed to flow in a state in which the growth chamber is closed, of course, the growth chamber is not exposed to the atmosphere in the replenishment of materials. Therefore, the problem of moisture absorption and the trouble of ignition related to phosphorus do not easily occur. Furthermore, it is known that phosphorus or a phosphorus compound produced by thermal decomposition of TBP does not very easily burn even if it contacts the atmosphere, though this is specific to the all-MOVPE method.

(2) Furthermore, in the all-MOVPE method, only organic compounds such as TBP and trimethylindium (TMI) are used as materials of the deposition of InP. Therefore, these materials are easily thermally decomposed, and the deposition temperature can be decreased to 550° C. or lower, in particular, 500° C. or lower. Accordingly, by depositing only the InP window layer by the all-MOVPE method, the InP window layer can be formed while maintaining the multiquantum well layer (absorption layer)/diffusion concentration distribution control layer having good crystal qualities.

After the absorption layer and the diffusion concentration distribution control layer are deposited on the InP substrate by the MBE method, the stacked structure including the absorption layer and the diffusion concentration distribution control layer may be exposed to the atmosphere, and the stacked structure and may then be charged in a growth chamber in MOVPE to deposit the InP window layer. In this case, the substrate of an intermediate product can be easily taken from an MBE deposition apparatus to the outside air and charged in an MOVPE deposition apparatus without preparing a vacuum transportation device or the like.

In a method for producing a light-receiving element array of the present invention, in order to produce a light-receiving element array in which a plurality of light-receiving elements are arranged, the group III-V compound semiconductor stacked structure is used in common and the any of the methods for producing a light-receiving element is applied to the plurality of light-receiving elements. In the step of selective diffusion of the impurity element, the impurity element is selectively diffused into the absorption layer for each light-receiving element through the diffusion concentration distribution control layer so that the light-receiving elements are separated from each other to decrease the concentration of the impurity element in the diffusion concentration distribution control layer to be $5 \times 10^{16}/cm^3$ or less toward the absorption layer side.

According to the above method for producing a light-receiving element array, by lowering the concentration of the impurity element, a multiquantum well structure having a bandgap energy corresponding to the near-infrared region can be formed without breaking of the multiquantum well structure, that is, without impairing the crystal quality. The impurity for forming a pn-junction of each light-receiving element is selectively diffused, that is, the impurity is introduced into the inside of the peripheral portion of each light-receiving element by diffusion so that the diffusion in the peripheral portion is two-dimensionally limited. Thus, the impurity is introduced so that the light-receiving elements are separated from each other. Accordingly, each of the light-receiving elements can be easily formed with a high accuracy, and element separation trenches need not be provided, and thus a light-receiving element array having a low dark current can be formed. Furthermore, since the impurity is selectively diffused through the diffusion concentration distribution control layer, the impurity concentration in the multiquantum well structure can be easily controlled to be low. The diffusion concentration distribution control layer has a bandgap energy smaller than the bandgap energy corresponding to that of InP. Therefore, even if a portion having a low impurity concentration is generated in a thickness range at the absorption layer side of the diffusion concentration distribution control layer, a decrease in the response time in a voltage-applied state can be prevented.

Advantages

According to the present invention, it is possible to provide a light-receiving element which has sensitivity in the near-infrared region and in which a good crystal quality is easily obtained, a one-dimensional or two-dimensional array of the light-receiving elements is easily formed with a high accuracy, and a dark current can be reduced; and a light-receiving element array in which the light-receiving elements are arranged.

BEST MODES FOR CARRYING OUT THE INVENTION

Embodiment 1

Embodiment of Semiconductor Stacked Structure and pn-junction

Figure 1:
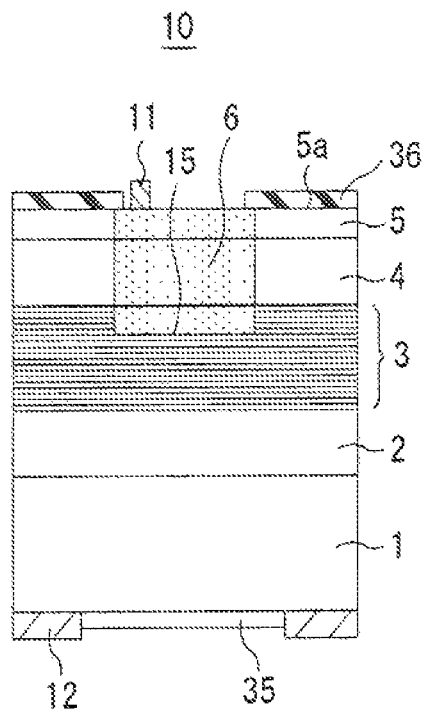
FIG. 1 is a cross-sectional view showing a light-receiving element according to Embodiment 1 of the present invention.

FIG. 1 is a cross-sectional view showing a light-receiving element 10 according to an embodiment of the present invention. Referring to FIG. 1, the light-receiving element 10 includes an InP substrate 1 and a group III-V compound semiconductor stacked structure (epitaxial wafer) disposed on the InP substrate 1 and having the following structure. (InP substrate 1/buffer layer 2/absorption layer 3 having a multiquantum well structure composed of InGaAs or GaInNAs and GaAsSb/InGaAs diffusion concentration distribution control layer 4/InP window layer 5).

A p-type region 6 extending from the InP window layer 5 to the absorption layer 3 having the multiquantum well structure is formed by selectively diffusing Zn, which is a p-type impurity, from an opening of a selective diffusion mask pattern 36 composed of a SiN film. Thus, Zn, which is a p-type impurity, is introduced into the inside of the peripheral portion of the light-receiving element 10 by diffusion so that the diffusion in the peripheral portion is two-dimensionally limited. This is achieved by conducting the diffusion using the selective diffusion mask pattern 36 composed of the SiN film.

A p-side electrode 11 made of AuZn and an n-side electrode 12 made of AuGeNi are provided on the p-type region 6 and the rear surface of the InP substrate 1, respectively, so as to form an ohmic contact. In this case, the InP substrate 1 is doped with an n-type impurity so as to ensure an electrical conductivity at a predetermined level. An antireflection film 35 made of SiON is also provided on the rear surface of the InP substrate 1 so that reflection of light is prevented when the light-receiving element 10 is used as a rear-illuminated-type light-receiving element in which the rear surface side of the InP substrate functions as an incident surface.

A pn-junction 15 is formed in the absorption layer 3 having the multiquantum well structure at a position corresponding to a boundary front of the p-type region 6. By applying a reverse bias voltage between the p-side electrode 11 and the n-side electrode 12, a depletion layer is more widely generated on the side in which the n-type impurity concentration is low (n-type impurity background). The background in the absorption layer 3 having the multiquantum well structure has an n-type impurity concentration (carrier concentration) of about $5 \times 10^{15}$ cm$^{-3}$ or less. The position 15 of the pn-junction is determined by an intersection between the background (n-type carrier concentration) of the absorption layer 3 having the multiquantum well and a concentration profile of Zn, which is a p-type impurity. That is, the position 15 of the pn-junction is the position shown in FIG. 2.

Figure 2:
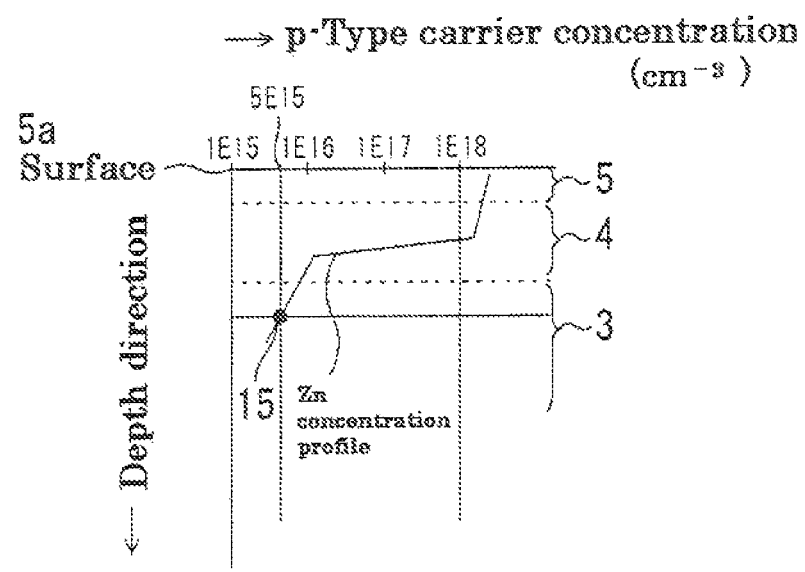
FIG. 2 is a drawing showing a Zn concentration distribution in the light-receiving element shown in FIG. 1.

In the diffusion concentration distribution control layer 4, the concentration of the p-type impurity that is introduced by selective diffusion from a surface 5a of the InP window layer 5 drastically decreases from a high-concentration region at the InP window layer side to the absorption layer side. Accordingly, in the absorption layer 3, a Zn concentration of $5 \times 10^{16}$ cm$^{-3}$ or less can be easily realized as an impurity concentration. In FIG. 2, a lower Zn concentration of about $1 \times 10^{16}$ cm$^{-3}$ or less is realized in the absorption layer 3.

Since the light-receiving element 10 targeted by the present invention aims to have sensitivity in the range from the near-infrared red region to the long-wavelength side thereof, the window layer is preferably composed of a material having a bandgap energy larger than the bandgap energy of the absorption layer 3. For this reason, InP, which is a material having a bandgap energy larger than that of the absorption layer and having good lattice match, is usually used as the window layer. Alternatively, InAlAs, which has a bandgap energy substantially the same as that of InP, may also be used.

Points in this Embodiment

Features of this embodiment lie in that the light-receiving element has the following configuration.

1. When a high concentration of an impurity is introduced into a multiquantum well structure by selective diffusion, the multiquantum well structure is broken. Therefore, it is necessary to suppress the amount of impurity introduced by the selective diffusion to be low. In general, it is necessary to control the concentration of the p-type impurity, which is to be introduced by diffusion, to be $5 \times 10^{16}$/cm$^3$ or less.

2. In order to stably obtain the above-mentioned low concentration of the p-type impurity with a good repeatability in the actual production, the diffusion concentration distribution control layer 4 composed of InGaAs is provided on the absorption layer 3. If, a diffusion concentration distribution control layer 4 having a portion adjacent to the absorption layer, the portion having a low impurity concentration, the electrical conduction property in the portion decreases or the electrical resistance in the portion increases. When the electrical conduction property of the portion having a low impurity concentration in the diffusion concentration distribution control layer 4 decreases, the responsiveness decreases, and, for example, good motion pictures cannot be obtained. However, in the case where the diffusion concentration distribution control layer 4 is composed of a material having a bandgap energy smaller than the bandgap energy corresponding to that of InP, specifically, a group III-V compound semiconductor material having a bandgap energy less than 1.34 eV, even if the impurity concentration is low, the electrical conduction property does not very significantly decrease because the light-receiving element is not used at absolute zero temperature. An example of the group III-V compound semiconductor material that satisfies the requirement of the diffusion concentration distribution control layer is InGaAs.

The reason why the impurity concentration of the absorption layer is controlled to be $5 \times 10^{16}$/cm$^3$ or less will be described in more detail. If the Zn concentration in the absorption layer 3 exceeds $1 \times 10^{17}$ cm$^{-3}$ because, for example, the depth of the selective diffusion of the p-type impurity (Zn) is increased, in a high-concentration portion, the Zn concentration of which exceeds $1 \times 10^{17}$ cm$^{-3}$, atoms of InGaAs and GaAsSb constituting the quantum well layers are disordered to each other, whereby a superlattice structure is broken. The crystal quality of the broken portion degrades, thereby degrading characteristics of the light-receiving element, for example, increasing the dark current. Here, the Zn concentration is usually measured by secondary ion mass spectroscopy (SIMS). However, it is difficult to analyze a concentration on the order of $10^{17}$ cm$^{-3}$ or $10^{16}$ cm$^{-3}$, and a relatively large measurement error is generated. The above detailed description concerns a discussion about the values of the Zn concentration with a double or half accuracy, and this is resulted from this roughness of the measurement accuracy. Accordingly, for example, discussing a difference between $5 \times 10^{16}$/cm$^3$ and $6 \times 10^{16}$/cm$^3$ is difficult from the standpoint of measurement accuracy and is not so significant.

By using a material having a narrow bandgap energy as the diffusion concentration distribution control layer 4, an increase in the electrical resistance can be suppressed even at a low impurity concentration. It is believed that the response time to the application of a reverse bias voltage or the like is determined by the CR time constant determined by the capacitance and the electrical resistance. Accordingly, the response time can be shortened by suppressing the increase in the electrical resistance R as described above.

3. In this embodiment, the multiquantum well structure has a type-II structure. In a type-I quantum well structure, in the case of a light-receiving element having a structure in which a semiconductor layer having a small bandgap energy is sandwiched between semiconductor layers having a large bandgap energy so as to have sensitivity in the near-infrared region, the upper limit of the wavelength (cutoff wavelength) of the sensitivity is determined by the bandgap of the semiconductor layer having the small bandgap energy. That is, the transition of electrons or holes caused by light is performed in the semiconductor layer having the small bandgap energy (direct transition). In this case, a material that extends the cutoff wavelength to a longer-wavelength region is very limited amount group III-V compound semiconductors. In contrast, in the type-II multiquantum well structure, when two different types of semiconductor layers having the same Fermi energy are alternately stacked, an energy difference between the conduction band of a first semiconductor and the valence band of a second semiconductor determines the upper limit of the wavelength (cutoff wavelength) of the sensitivity. That is, the transition of electrons or holes caused by light is performed between the valence band of the second semiconductor and the conduction band of the first semiconductor (indirect transition). Therefore, by controlling the energy of the valence band of the second semiconductor to be higher than that of the valence band of the first semiconductor, and controlling the energy of the conduction band of the first semiconductor to be lower than the energy of the conduction band of the second semiconductor, the sensitivity can be easily extended to the long-wavelength side, as compared with the case of the direct transition performed in a single semiconductor.

4. As described above, the p-type impurity is introduced into the inside of the peripheral portion of the light-receiving element by diffusion so that the diffusion in the peripheral portion is two-dimensionally limited by performing selective diffusion using the SiN selective diffusion mask pattern 36. Accordingly, the pn-junction descried above is not exposed on the end faces of the light-receiving element. As a result, leakage of a photocurrent is suppressed.

Figure 3:
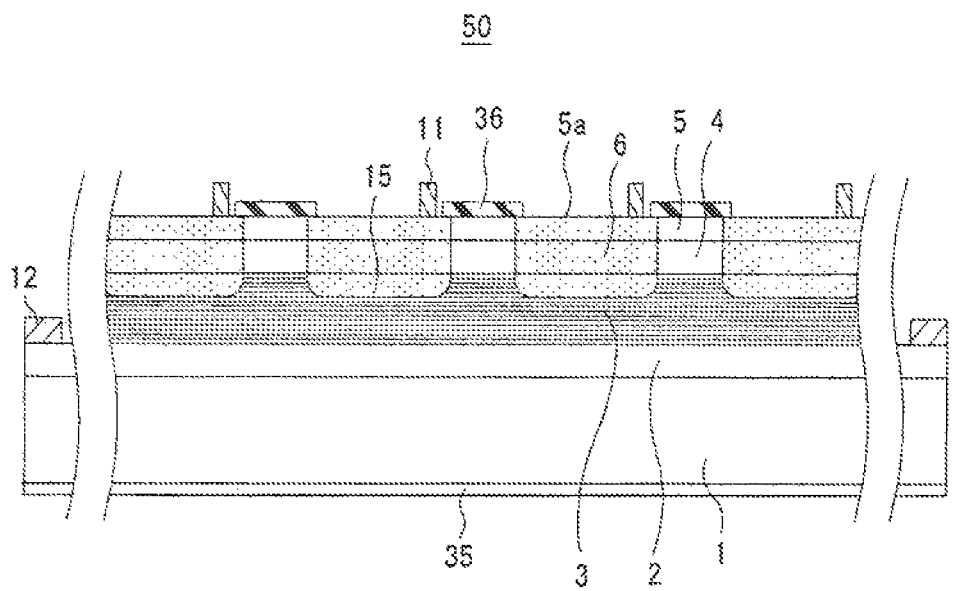
FIG. 3 is a cross-sectional view showing a light-receiving element array according to Embodiment 1 of the present invention.

FIG. 3 is a cross-sectional view showing a light-receiving element array 50 in which a plurality of the light-receiving elements 10 described above are arranged on an epitaxial wafer including a common InP substrate 1. A feature of this light-receiving element array 50 lies in that the plurality of light-receiving elements 10 are arranged without providing element separation trenches. As described in item 4 above, a p-type region 6 is limited inside each of the light-receiving elements, and adjacent light-receiving elements are reliably separated from each other. An absorption layer 3 is formed so as to have a multiquantum well structure, a diffusion concentration distribution control layer 4 is disposed on the absorption layer 3, and the p-type impurity concentration in the absorption layer 3 is controlled to be $5 \times 10^{16}$ cm$^{-3}$ or less. These points etc. are the same as those of the light-receiving element 10 shown in FIG. 1.

Next, a method for producing the light-receiving element 10 shown in FIG. 1 will be described. A buffer layer 2 is deposited on an n-type InP substrate 1. The buffer layer 2 is preferably an InP or InAlAs film having a thickness of 2 μm or an InGaAs film having a thickness of 0.15 μm. Subsequently, an absorption layer 3 having a multiquantum well structure composed of (InGaAs/GaAsSb) or (GaInNAs/GaAsSb) is formed. The thickness of the GaInNAs layer or the GaAsSb layer forming a unit quantum well structure is 5 nm, and the number of pairs (the number of repetitions of the unit quantum well) is 300. Subsequently, as a diffusion concentration distribution control layer 4, which functions in the introduction of Zn by diffusion, an InGaAs layer having a thickness of 1 μm is epitaxially grown on the absorption layer 3. Lastly, an InP window layer 5 having a thickness of 1 μm is then epitaxially grown. Both the absorption layer 3 and the diffusion concentration distribution control layer 4 are preferably epitaxially grown by a molecular beam epitaxy (MBE) method. The InP window layer 5 may be epitaxially grown by the MBE method. Alternatively, the InP substrate 1 may be taken out from an MBE apparatus after the growth of the diffusion concentration control layer 4, and the InP window layer 5 may be epitaxially grown by a metalorganic vapor phase epitaxy (MOVPE) method.

The InP buffer layer 2, the InAlAs buffer layer 2, or the InGaAs buffer layer 2 may be non-doped or may be doped with an n-type dopant such as silicon (Si) in a concentration of about $1 \times 10^{17}$ cm$^{-3}$. The absorption layer 3 having the multiquantum well structure composed of GaInNAs/GaAsSb, the diffusion concentration distribution control layer 4 composed of InGaAs, and the InP window layer 5 are preferably non-doped. However, these layers may be doped with a trace amount (for example, about $2 \times 10^{15}$ cm$^{-3}$) of an n-type dopant such as Si. Furthermore, in order to form an n-side electrode on the buffer layer, the buffer layer 2 may be doped with an n-type dopant in an amount of about $1 \times 10^{18}$ cm$^{-3}$. In such a case, the InP substrate 1 may be an Fe-doped semi-insulating InP substrate.

An optical device is produced using the stacked structure (epitaxial wafer) including the InP substrate 1. Selective diffusion of Zn is performed from an opening of a SiN selective diffusion mask pattern 36 formed on a surface 5a of the InP window layer 5. Thus, a p-type region 6 is formed so as to extend in the absorption layer 3 having the (GaInNAs/GaAsSb) multiquantum well structure. A front end portion of the p-type region 6 forms a pn-junction 15. In this case, a high-concentration region having a Zn concentration of about $1 \times 10^{18}$ cm$^{-3}$ or more is limited in the InGaAs diffusion concentration distribution control layer 4. That is, the above high-concentration impurity distribution continues from the surface 5a of the InP window layer 5 to the inside of the InGaAs diffusion concentration distribution control layer 4 in the depth direction, and decreases to $5 \times 10^{16}$ cm$^{-3}$ or less at a deeper position in the diffusion concentration distribution control layer 4. The Zn concentration distribution near the pn-junction 15 shows a graded junction.

As for a one-dimensional or two-dimensional arrangement of the light-receiving elements 10, that is, the light-receiving element array shown in FIG. 3, adjacent light-receiving elements are separated from each other by performing selective diffusion of Zn (diffusion that is two-dimensionally limited so that a diffused portion is disposed inside a peripheral portion of each light-receiving element 10) without performing mesa etching for element separation. Specifically, the Zn selective diffusion region 6 constitutes a main portion of one light-receiving element 10 and forms one pixel, and regions where Zn does not diffuse separate respective pixels from each other. Therefore, the light-receiving element array does not suffer from, for example, crystal damage caused by mesa etching, and thus a dark current can be suppressed.

Patent Document 2 describes a concern that, in the case where the pn-junction 15 is formed by selective diffusion of an impurity, the distance between light-receiving elements cannot be decreased to a certain dimension or less because the impurity diffuses not only in the depth direction but also in the lateral direction (the direction orthogonal to the depth direction). However, according to an experimental result of selective diffusion of Zn, it was confirmed that, in the structure in which the InP window layer 5 is disposed on the top surface and the InGaAs diffusion concentration distribution control layer 4 is disposed under the InP window layer 5, the area of the diffusion in the lateral direction is substantially the same as or smaller than the area of the diffusion in the depth direction. That is, in selective diffusion of Zn, although Zn diffuses in the lateral direction so that the diameter of a diffusion region is larger than the diameter of an opening of a mask pattern, the degree of diffusion is small and the region is only slightly expanded from the opening of the mask pattern, as schematically shown in, for example, FIGS. 1 and 3.

Figure 4:
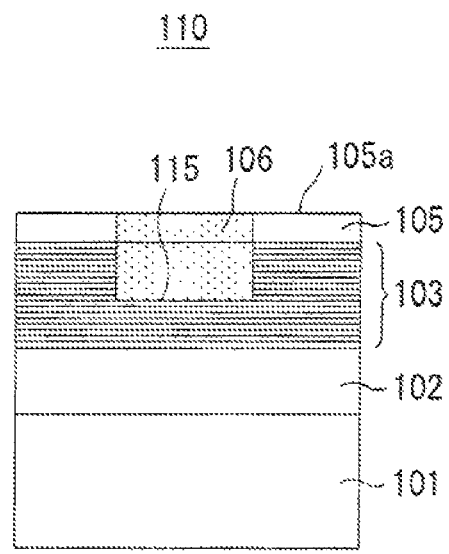
FIG. 4 is a cross-sectional view of a light-receiving element of Reference Example 1 that is different from the present invention.

FIG. 4 is a cross-sectional view of a light-receiving element 110 of Reference Example 1 that is different from the present invention. The light-receiving element 110 of Reference Example 1 has the following stacked structure.
(InP substrate 101/InP, InAlAs, or InGaAs buffer layer 102/absorption layer 103 having (GaInNAs/GaAsSb) multiquantum well structure/InP window layer 105).

This stacked structure differs from the stacked structure of the embodiment of the present invention in that the diffusion concentration distribution control layer is not provided. That is, the absorption layer 103 having the multiquantum well structure is disposed directly under the InP window layer 105.

Figure 5:
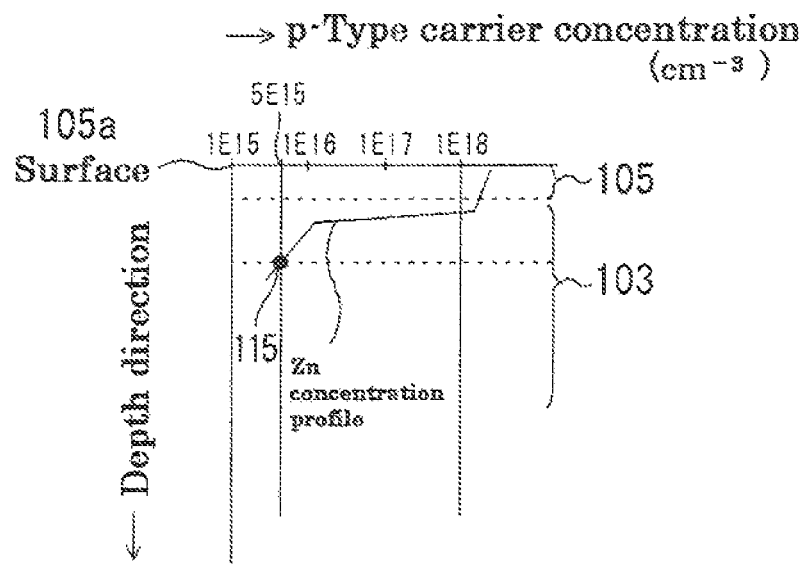
FIG. 5 is a drawing showing a Zn concentration distribution in the light-receiving element shown in FIG. 4.

When the diffusion concentration distribution control layer is not provided, as shown in FIG. 5, for example, as for the Zn concentration distribution, a high-concentration impurity region extends to the absorption layer 103 having the multiquantum well structure. Specifically, in the multiquantum well structure, a high-concentration impurity region of $1 \times 10^{18}$ cm$^{-3}$, which exceeds $5 \times 10^{16}$ cm$^{-3}$, is formed. When a high-concentration impurity is introduced in the multiquantum well structure, the structure is broken, and the dark current significantly increases. In order to prevent such a high-concentration impurity region from being formed in the multiquantum well structure, the diffusion concentration distribution control layer is formed, and selective diffusion is then performed.

However, there is a possibility for realizing the following ideas regarding the selective diffusion of Zn.
(1) The time required for introduction by diffusion is limited to be short so that a high-concentration region does not reach the multiquantum well structure 103.
(2) The thickness of the InP window layer 105 is increased so that the InP window layer 105 has the function of the diffusion concentration distribution control layer.

Figure 6:
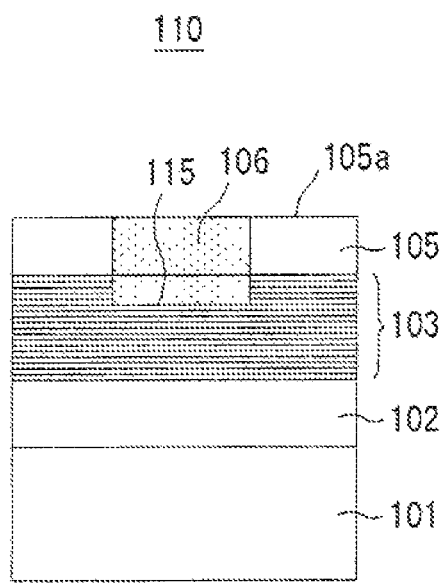
FIG. 6 is a cross-sectional view of a light-receiving element of Reference Example 2 that is different from the present invention.
Figure 7:
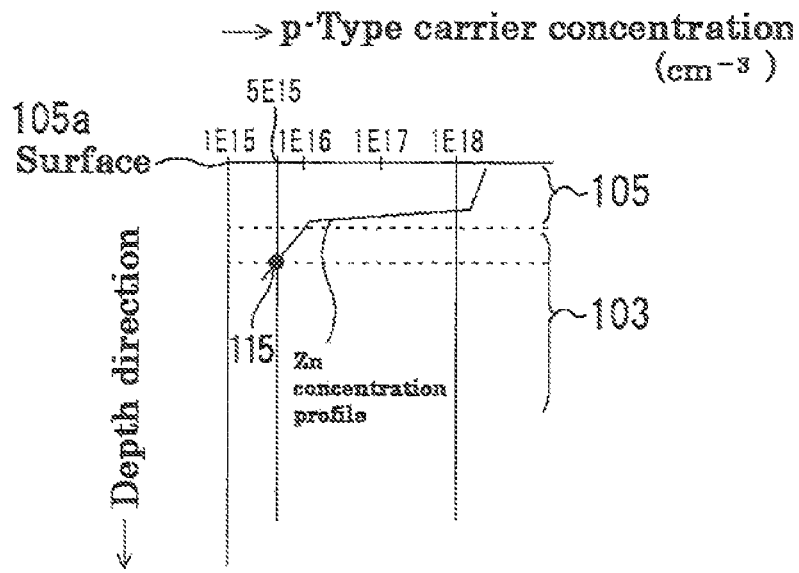
FIG. 7 is a drawing showing a Zn concentration distribution in the light-receiving element shown in FIG. 6.

FIG. 6 is a cross-sectional view showing a light-receiving element 110 of Reference Example 2 for examining the cases of (1) and (2) described above. A light-receiving element 110 of Reference Example 2 has a stacked structure substantially the same as that of the light-receiving element 110 of Reference Example 1, but the thickness of an InP window layer 105 is larger than that of Reference Example 1. The light-receiving element 110 of Reference Example 2 corresponds to the case of (2) above, but can also be used for examining the case of (1) above. In the stacked structure shown in FIG. 6, selective diffusion was performed so that a high-concentration region of Zn is not formed in the multiquantum well structure 103. As a result, a Zn concentration distribution shown in FIG. 7 is obtained. In the case of the Zn concentration distribution shown in FIG. 7, in the InP window layer 105, the Zn concentration drastically decreases from a high concentration to a low concentration, and a low-concentration impurity region with a concentration of about $1 \times 10^{16}$ cm$^{-3}$ is formed at the absorption layer side of the InP window layer 105.

When the low-concentration impurity region with a concentration of about $1 \times 10^{16}$ cm$^{-3}$ is formed in the InP window layer 105, the electrical resistance in the region increases, thereby decreasing the response time, as repeatedly described above. Accordingly, the function of the diffusion concentration distribution control layer cannot be provided to a material having a bandgap energy that is large enough to form the window layer, specifically, to the InP window layer 105, which is a typical example of the material. This applies to both the cases of (1) and (2) above. Accordingly, a material having a bandgap energy corresponding to that of InP or less, specifically, a material that satisfies a bandgap energy of less than 1.34 eV is preferably used as the diffusion concentration control layer. That is, it is necessary to use a material, such as InGaAs, in which a decrease in the electrical conductivity is relatively small and an increase in the electrical resistance is relatively small even in a low-concentration impurity region.

Embodiment 2

Prevention of Surface Accumulation of Sb

Antimony (Sb) is known as an element that exhibits a surfactant effect in a semiconductor material such as silicon. Such an element that exhibits the surfactant effect has a strong tendency of accumulating on a surface of a semiconductor material, though the reason is not completely clear.

The light-receiving element 10 described in Embodiment 1 includes the absorption layer 3 having a multiquantum well structure composed of (InGaAs/GaAsSb) or (GaInNAs/GaAsSb), and thus the absorption layer 3 contains Sb. Therefore, if no measures are taken, during the deposition of the diffusion concentration distribution control layer 4 subsequent to the deposition of the absorption layer 3, Sb is sequentially accumulated on the surface of the diffusion concentration distribution control layer 4 in the course of the growth, and is accumulated also on the surface after the completion of the deposition. A problem in this case lies in that the crystal surface is roughened, and the leakage current increases in an area having a rough surface, resulting in an increase in the dark current. Furthermore, when the InGaAs diffusion concentration distribution control layer 4 on which Sb is accumulated is formed and, for example, the InP window layer 5 is then formed thereon, Sb in the diffusion concentration distribution control layer 4 is attracted to the interface between the InP window layer 5 and the diffusion concentration distribution control layer 4 to form an Sb-rich layer.

Figure 8:
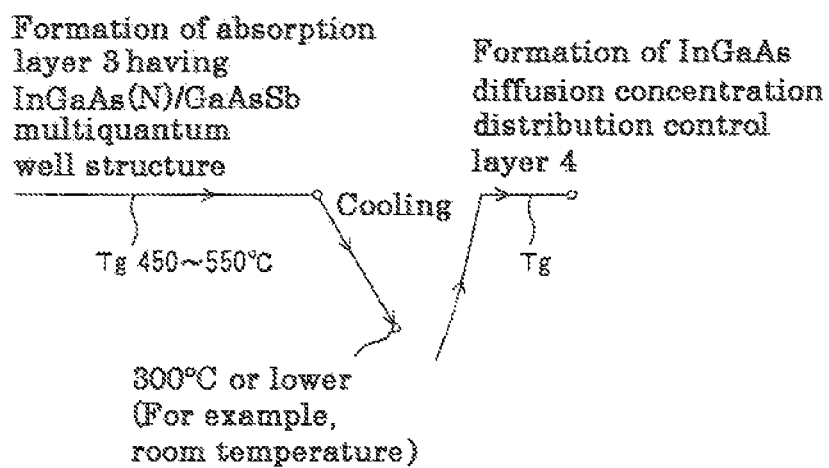
FIG. 8 is a drawing illustrating a method for fabricating an epitaxial laminate of a light-receiving element array according to Embodiment 2 of the present invention.

FIG. 8 is a drawing showing a method for forming the absorption layer 3 having a multiquantum well structure composed of InGaAs(N)/GaAsSb, and the InGaAs diffusion concentration distribution control layer 4 in Embodiment 2 of the present invention. As described above, the absorption layer 3 having the multiquantum well structure is preferably deposited by an MBE method in which a composition interface can be drastically changed. A deposition is performed at a deposition temperature Tg in the range of 450° C. to 550° C. When the InGaAs diffusion concentration distribution control layer 4 is formed on the absorption layer 3 while maintaining the same temperature, as described above, Sb is moved from the absorption layer 3 and is accumulated (piled up) on the diffusion concentration distribution control layer 4. In the method for producing a light-receiving element according to this embodiment, after the formation of the absorption layer 3, cooling is once performed to 300° C. or lower, preferably 200° C. or lower, and more preferably 100° C. or lower. As a result, Sb cannot maintain a diffusion rate at which the Sb diffuses from the inside so as to accumulate on a surface, and is covered with the diffusion concentration distribution control layer 4 whose thickness is increasing. In contrast, when the InGaAs diffusion concentration distribution control layer 4 is successively deposited while maintaining the deposition temperature of the absorption layer 3, Sb is sequentially accumulated on the growth surface as if it springs from the absorption layer 3. It is believed that, however, when cooling is once performed to, for example, 100° C. after the formation of the absorption layer 3, Sb settles in the crystal structure of GaAsSb, the atomic force maintains Sb at a stable position, and an upper layer portion of the absorption layer 3 and the InGaAs diffusion concentration distribution control layer 4 function as a cover.

Figure 9:
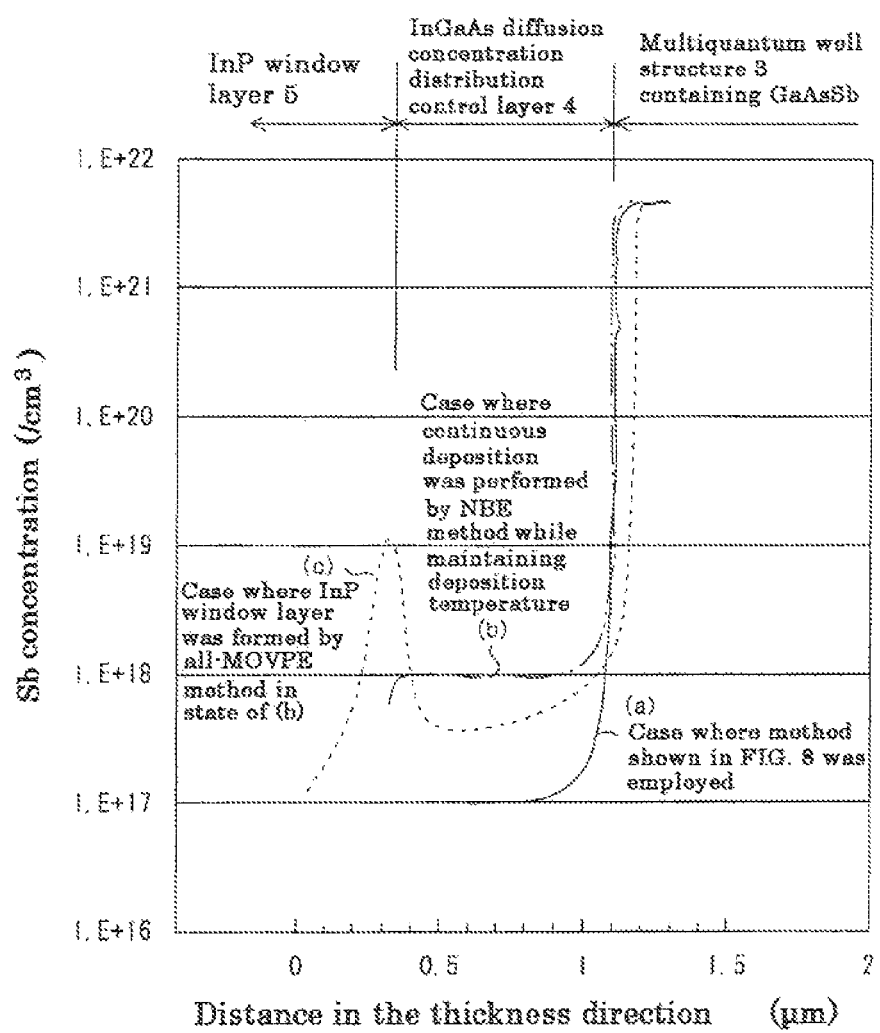
FIG. 9 is a schematic graph illustrating concentration distributions of antimony (Sb) in the depth direction.

FIG. 9 is a schematic graph showing Sb concentration distributions, and detailed measured data is shown in Example 2. In an Sb concentration distribution ((a) of FIG. 9) obtained by the production method according to this embodiment shown in FIG. 8, the Sb concentration is maintained to be $1 \times 10^{18}/cm^3$ or less in the diffusion concentration distribution control layer 4 and the InP window layer 5. In contrast, when the diffusion concentration distribution control layer 4 is formed while maintaining the deposition temperature of the absorption layer (b), an Sb concentration of the diffusion concentration distribution control layer 4 becomes high; about $1 \times 10^{18}/cm^3$ ((b) of FIG. 9). Once a high-Sb-concentration distribution is formed in the diffusion concentration distribution control layer 4, even when this diffusion concentration distribution control layer 4 is cooled by being exposed to the outside air, in the case where the InP window layer 5 is deposited by an all-MOVPE method (c), an Sb accumulation layer (pile-up layer) is formed at the interface between the InP window layer 5 and the InGaAs diffusion concentration distribution control layer 4 ((c) of FIG. 9). This Sb accumulation layer is formed by Sb moved from the InGaAs diffusion concentration distribution control layer 4. Furthermore, Sb also seems to be moved from the multiquantum well structure 3 containing GaAsSb.

As described above, by using the method shown in FIG. 8, the Sb concentration in the diffusion concentration distribution control layer 4 can be decreased, as compared with the case where the absorption layer 3 and the diffusion concentration distribution control layer 4 are successively deposited while maintaining the deposition temperature of the absorption layer. In addition, when the InP window layer 5 is formed, an Sb accumulation layer is not formed at the boundary between the InP window layer 5 and the InGaAs diffusion concentration distribution control layer 4. When Sb is moved from the absorption layer 3 to the diffusion concentration distribution control layer 4, the surface is roughened and the crystal quality is degraded. It is believed that this is due to the formation of holes from which Sb is removed. Consequently, leakage current is increased, resulting in an increase in the dark current. According to the method shown in FIG. 8, roughening of the crystal surface is prevented, and the increase in the dark current is also prevented. In addition, a deviation of the proportion of Sb in the absorption layer 3 can be suppressed by preventing Sb from omitting.

Figure 10:
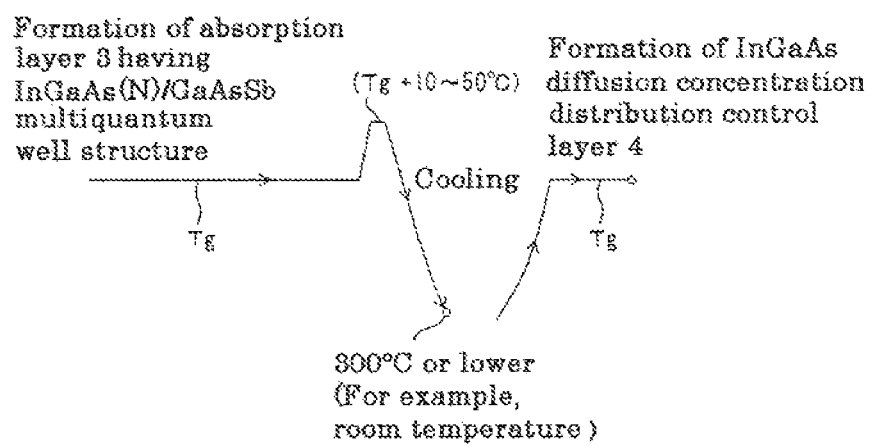
FIG. 10 is a drawing showing a modification of the production method shown in FIG. 8, which is an example of an embodiment of the present invention.

FIG. 10 is a drawing showing an example of an embodiment of the present invention, which is a modification of the method shown in FIG. 8. In the method shown in FIG. 10, after the formation of the multiquantum well structure 3 containing GaAsSb and before cooling, the multiquantum well structure 3 containing GaAsSb is maintained in a temperature range 10° C. to 50° C. higher than the deposition temperature Tg for 10 to 30 minutes by heating. This heating is performed in order to remove Sb accumulated on the surface of the multiquantum well structure by thermal desorption. After this heating, the multiquantum well structure 3 containing GaAsSb is cooled to 300° C. or lower, for example, 100° C. or lower so that Sb is settled in the GaAsSb crystal structure where the absorption layer is to be present. The method shown in FIG. 10 can also provide the Sb concentration distribution of (a) shown in FIG. 9.

Embodiment 3

Hybrid Growth Method (Deposition of InP Window Layer)

In order to increase the light-receiving efficiency in the absorption layer 3 having a type II InGaAs(N)/GaAsSb multiquantum well structure, it is necessary that the number of pairs of InGaAs(N) and GaAsSb be 100 or more. If this multiquantum well structure is formed by an MOVPE method, the pairs are formed while switching source gases. However, since the source gases remain in a growth chamber, pairs in which the composition drastically changes at layer interfaces cannot be obtained. In contrast, in the MBE method, pairs in which the composition drastically changes at interfaces can be stacked by switching a shutter, as described above. For this reason, the absorption layer 3 having the multiquantum well structure is preferably formed by the MBE method.

On the other hand, when the InP window layer 5 is grown by the MBE method, the following problems occur.

(P1) It is difficult to deposit InP with a high purity by the MBE method. This is because phosphorus, which has a high hygroscopic property, is attached to inner walls of a growth chamber, and even a very small amount of moisture acts as an impurity that decreases the purity of crystals.

(P2) In the formation of a layer containing phosphorus, such as an InP layer, phosphorus (P) or a phosphorus (P) compound is attached to inner walls of a growth chamber and deposited. Phosphorus or such a P compound may react with oxygen in air and ignite. In the deposition by the MBE method, it is necessary to open the growth chamber to the atmosphere even when materials are replenished, and it is also necessary to open the growth chamber to the atmosphere when a trivial maintenance is performed. Therefore, not only the phosphorus attached to the inner walls of the growth chamber absorbs moisture as described above, but also the probability of the occurrence of a trouble that the phosphorus reacts with oxygen and ignites increases.

The all-MOVPE method can avoid both the above-described problems (P1) and (P2). Advantages of growing the InP window layer 5 by the all-MOVPE method are as follows:

(1) In the all-MOVPE method (similarly to the normal MOVPE method), a growth chamber 61 is not opened to the atmosphere very often. Of course, the growth chamber 61 is not exposed to the atmosphere in the replenishment of materials. Therefore, the problems of moisture absorption, ignition, and the like related to phosphorus do not easily occur. Furthermore, it is known that phosphorus or a phosphorus compound produced by thermal decomposition of tertiarybutylphosphine (TBP) does not very easily burn even if it contacts the atmosphere, though this is specific to the all-MOVPE method.

(2) In the all-MOVPE method, only organic compounds of TBP and trimethylindium (TMI) are used as materials of the deposition of InP. Accordingly, these materials are easily thermally decomposed, and thus the deposition temperature can be decreased to 550° C. or lower, in particular, 500° C. or lower. When $PH_3$, which is an inorganic substance serving as a phosphorus source, is used, the thermal decomposition temperature cannot be decreased to a desired low temperature. By depositing the InP window layer 5 by the all-MOVPE method, the InP window layer 5 can be formed while maintaining the multiquantum well layer (absorption layer)/diffusion concentration distribution control layer having good crystal qualities. When the substrate is heated to 600° C. or higher in order to form the InP window layer 5, a problem of degrading the crystal quality of the InGaAs(N)/GaAsSb multiquantum well structure occurs. When the InP window layer 5 is formed by the all-MOVPE method, only organic compounds are used as materials, as described above. Accordingly, the materials are thermally decomposed at low temperatures, for example, at 500° C. or lower, and the InP layer can be grown at the thermal decomposition temperature. The all-MOVPE method is prominent as compared with other methods in that the InP window layer 5 is grown at a low temperature.

Figure 11:
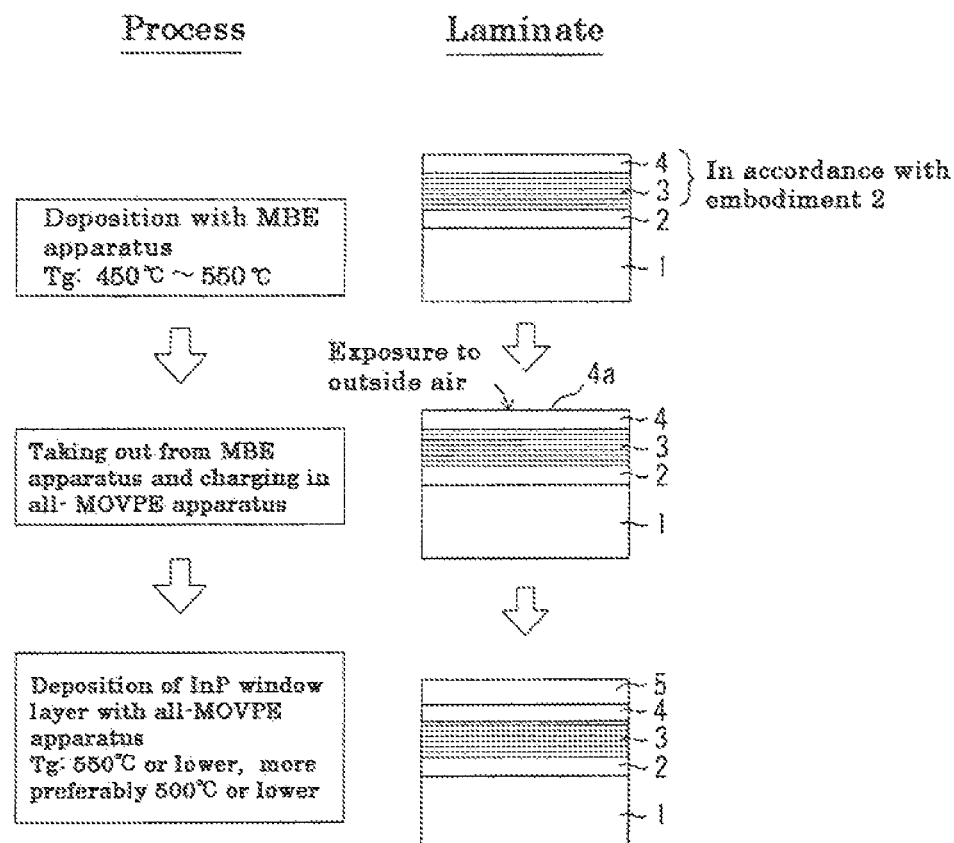
FIG. 11 includes views illustrating a method (hybrid growth method) for fabricating an epitaxial laminate of a light-receiving element array according to Embodiment 3 of the present invention.

FIG. 11 includes views illustrating a method for producing a light-receiving element according to Embodiment 3 of the present invention. In FIG. 11, a laminate constituted by (InP substrate 1/InGaAs, InAlAs, or InP buffer layer 2/absorption layer 3 having an InGaAs(N)/GaAsSb multiquantum well structure/InGaAs diffusion concentration distribution control layer 4) is grown by the MBE method. The deposition temperature Tg is in the range of 450° C. to 550° C. After the formation of the absorption layer 3 and before the formation of the InGaAs diffusion concentration distribution control layer 4, it is preferable to once cool the laminate to 300° C. or lower, preferably 100° C. or lower (Embodiment 2). The diffusion concentration distribution control layer 4 is deposited by the method described in Embodiment 2 with an MBE apparatus, and a wafer or a substrate (laminate) which is an intermediate product is then taken out from the MBE apparatus and charged in an MOVPE apparatus. In this step, a surface 4a of the diffusion concentration distribution control layer 4 is exposed to the outside air. Subsequently, the InP window layer 5 is deposited in the all-MOVPE apparatus at a temperature of the wafer or the substrate (laminate) of the intermediate product of 550° C. or lower, more preferably, 500° C. or lower. Thus, after the deposition by the MBE method, the InP layer is deposited by the all-MOVPE method, and therefore, the deposition method shown in FIG. 11 is referred to as "hybrid growth method" in this description.

Figure 12:
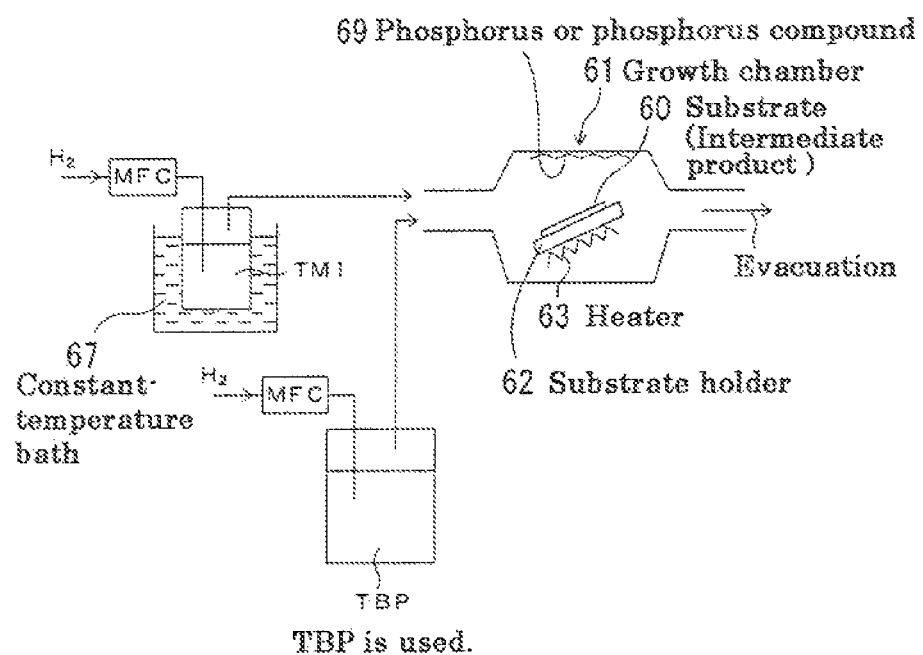
FIG. 12 is a view showing the overall structure of an apparatus for depositing an InP window layer by a metalorganic vapor phase epitaxy (MOVPE) method.

FIG. 12 is a view showing the overall structure of an apparatus used when the InP layer 5 is formed by the all-MOVPE method. A growth chamber 61 in the all-MOVPE method is the growth chamber 61 formed of a quartz tube or a stainless steel tube, as described above. A wafer or a substrate 60 of an intermediate product is attached to a substrate holder 62. An InP window layer 5 having a good crystal quality is grown while heating the substrate 60 of the intermediate product together with the substrate holder 62 with a heater 63 so that the deposition temperature or the substrate temperature is maintained at 550° C. or lower, preferably 500° C. or lower. In the all-MOVPE method, materials for growing InP are TMI serving as an indium source and TBP serving as a phosphorus source that are transported by a hydrogen carrier gas, the flow rate of which is controlled with a mass flow controller (MFC). Phosphine ($PH_3$) is not used because the decomposition temperature thereof is high.

TMI is used as a material in the form of solid, but is maintained at a constant temperature in a constant-temperature bath 67 so as to keep the sublimation pressure constant. These materials are organic compounds, carried to the growth chamber 61, and decomposed by bringing into contact with the substrate temperature on the substrate 60 of the intermediate product. Thus, InP is grown on the substrate 60 of the intermediate product.

Important points of the all-MOVPE apparatus shown in FIG. 12 are summarized to the following two points.

(1) Although phosphorus compound 69 is attached to inner walls of the growth chamber 61, the growth chamber 61 is not opened to the atmosphere very often. Therefore, the problems of moisture absorption and a reaction with oxygen (ignition) due to phosphorus or a phosphorus compound do not easily occur.

(2) As for the materials of InP, both the source of indium (group III) and the source of phosphorus (group V) are organic compounds, and thus the InP layer 5 can be grown at a temperature of the substrate 60 of 550° C. or lower, in particular, 500° C. or lower. According to the hybrid growth method of this embodiment, the absorption layer 3 having a multiquantum well structure in which the composition is drastically changed at interfaces is obtained by the MBE method, and the InP window layer 5 having a good crystal quality can then be obtained by the all-MOVPE method in a temperature range in which a good crystal quality of the absorption layer 3 having the multiquantum well structure is maintained while avoiding the problems due to phosphorus or the like attached to the inner walls of the growth chamber.

EXAMPLE 1

Figure 13:
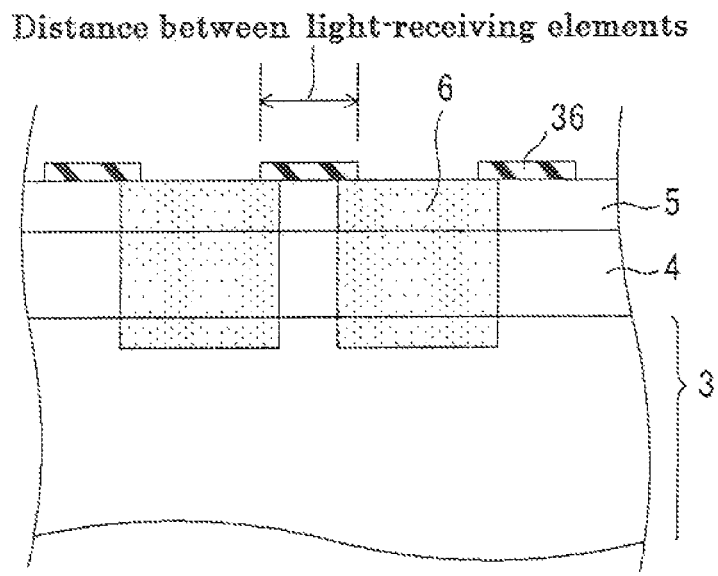
FIG. 13 is a partial cross-sectional view of a light-receiving element array used in Example 1.

Example 1—Verification of Pixel Pitch and Zn Diffusion Concentration Distribution To which degree the distance between light-receiving elements or the pixel pitch of the light-receiving element array of the present invention can be decreased was verified by way of Example using the light-receiving element array shown in FIG. 3. The distance between light-receiving elements or the pixel pitch is the width of the masking portion of the SiN selective diffusion mask pattern 36, as shown in FIG. 13. After the selective diffusion of Zn, a p-side electrode 11 made of AuZn and an n-side electrode 12 made of AuGeNi were formed. In the case of FIG. 3, an Fe-doped semi-insulating substrate is used as the InP substrate 1, and the n-side electrode 12 is provided on the buffer layer 2 containing an impurity at a high concentration. In the case where the n-type InP substrate 1 is used as shown in FIG. 1, the n-side electrode 12 may be provided on the rear surface of the substrate, or the n-side electrode may be provided on an n-type semiconductor layer (e.g., buffer layer 2) adjacent to the substrate on the top surface side of the substrate. In this Example, a reverse bias voltage of 5 V was applied between the p-side electrode 11 and the n-side electrode 12 of the light-receiving element array shown in FIG. 3 to measure the dark current. Light-receiving element arrays having two types of the thickness of the InP window layer 5 of 0.6 µm and 1.6 µm and seven types of the distance between light-receiving elements in the range of 3 to 20 µm were produced to measure the dark current. The thickness of the diffusion concentration distribution control layer 4 was 1 µm.

Figure 14:
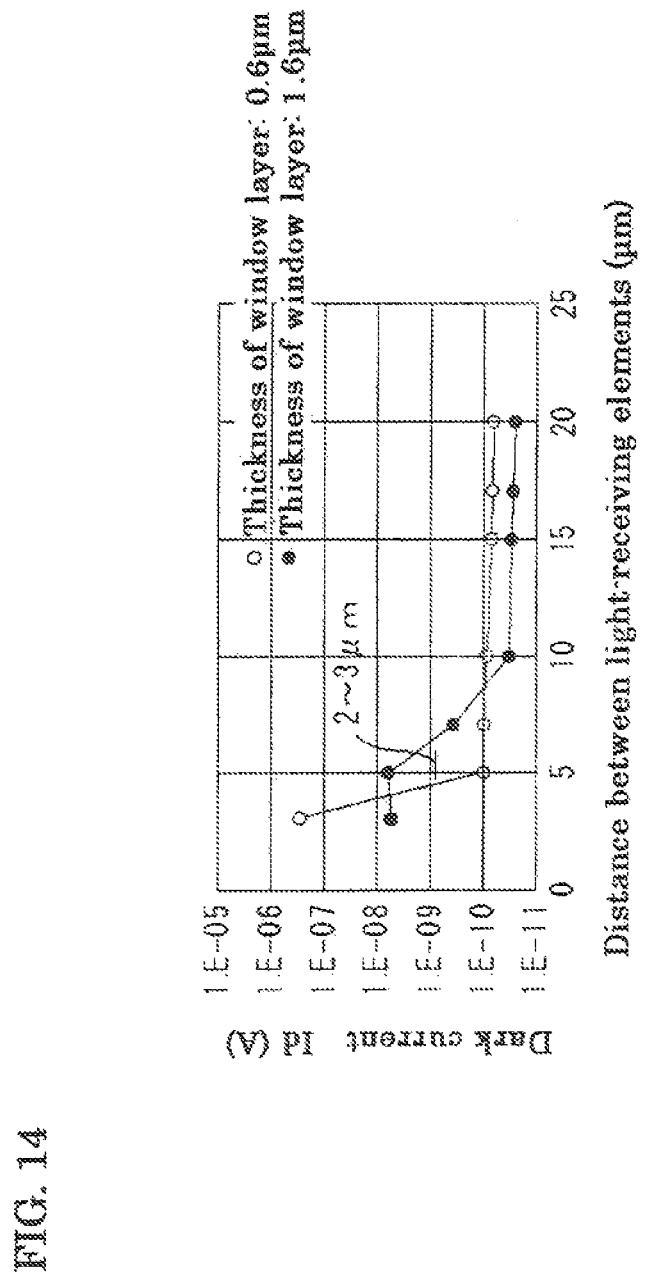
FIG. 14 is a graph showing the relationship between a dark current and the distance between light-receiving elements measured in Example 1.

The results are shown in FIG. 14. Referring to FIG. 14, in the case where the InP window layer 5 has a small thickness of 0.6 µm, even when the distance between light-receiving elements or the pixel pitch is reduced to 5 µm, the dark current can be suppressed to $1 \times 10^{-10}$ A (ampere). In the case where the InP window layer 5 has a thickness of 1.6 µm, diffusion of Zn expands in the lateral direction as described above. Therefore, unless the distance between light-receiving elements exceeds 7 µm, the dark current cannot be suppressed to $1 \times 10^{-10}$ A. However, in this Example, it was confirmed that the distance between light-receiving elements could be reduced to 5 µm by reducing the thickness of the InP window layer 5 to 0.6 µm and disposing the diffusion concentration distribution control layer 4.

Figure 15:
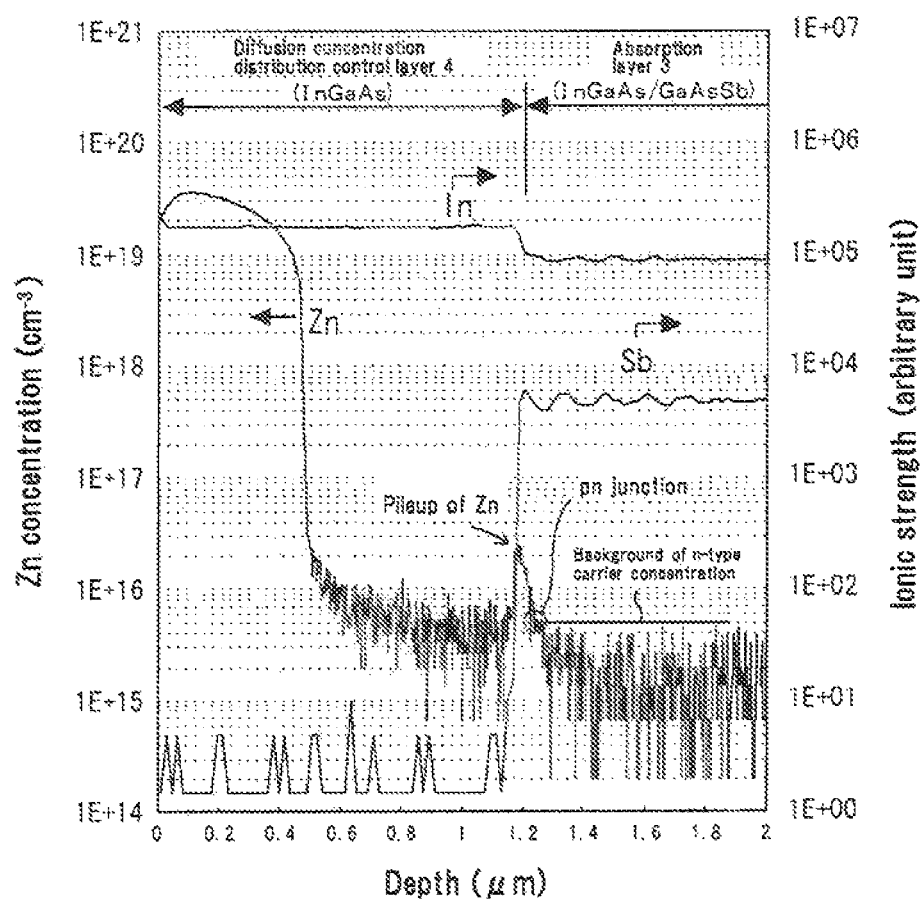
FIG. 15 is a graph showing a concentration distribution of Zn in the depth direction in Example 1.

The function of the diffusion concentration distribution control layer 4 was verified by analyzing a concentration distribution of Zn in the depth direction by SIMS. FIG. 15 shows a concentration distribution of Zn in the depth direction. Referring to FIG. 15, at the interface between the InGaAs diffusion concentration distribution control layer 4 and the absorption layer 3, the peak value of pile-up of Zn is suppressed to $5 \times 10^{16}$ cm$^{-3}$ or less. Accordingly, in a pn-junction formed at a crossing position (a circle mark in the figure) of the background of the n-type carrier concentration of the absorption layer 3 and the Zn concentration, the Zn concentration can be reliably reduced, and degradation of the crystal quality or the like can be prevented. In addition, disposing this diffusion concentration distribution control layer 4, it becomes possible for the multiquantum well structure of the absorption layer to achieve the original function thereof.

EXAMPLE 2

Example 2—Verification of Prevention of Surface Accumulation of Sb

An advantage of the method shown in FIG. 8 described in Embodiment 2 of the present invention was verified by way of Example. Specimens are Invention Example A1 and Comparative Example B1.

Invention Example A1

A Si-doped InGaAs buffer layer 2 (n-type carrier concentration $1 \times 10^{17}$/cm$^3$, thickness 0.1 µm) was deposited on a S-doped InP substrate 1 by an MBE method. Subsequently, an absorption layer 3 having a multiquantum well structure including pairs of (non-doped InGaAs/non-doped GaAsSb) was stacked at a substrate temperature of 480° C. Each of the layers had a thickness of 5 nm, and the thickness of each pair was 10 nm. The number of pairs was 250. As for the lattice constant, both InGaAs and GaAsSb were lattice-matched with InP in the range of −0.3% to +0.3%. After the formation of the absorption layer 3 having the multiquantum well structure, crystal growth was interrupted, and the wafer was cooled and transferred to a waiting chamber continuous to an MBE growth chamber through a gate valve. The wafer was cooled here to room temperature. The wafer was then returned to the MBE growth chamber, and a non-doped InGaAs diffusion concentration distribution control layer 4 (having a thickness of 1 µm) was deposited. Subsequently, the wafer was taken out from an MBE apparatus and charged to an all-MOVPE apparatus. An InP window layer 5 was deposited by the all-MOVPE method.

Comparative Example B1

An absorption layer having the same multiquantum well structure (non-doped InGaAs/non-doped GaAsSb: the thickness of pair 10 nm, 250 pairs) as that of Invention Example A1 was formed. A non-doped InGaAs diffusion concentration distribution control layer 4 having a thickness of 1 µm was successively deposited while maintaining a substrate temperature of 480° C. At this stage, the Sb concentration distribution was once measured. The resulting wafer was then charged to an all-MOVPE apparatus and an InP window layer 5 was deposited.

Evaluation was conducted by measuring the Sb concentration in the thickness direction by SIMS.

Figure 16:
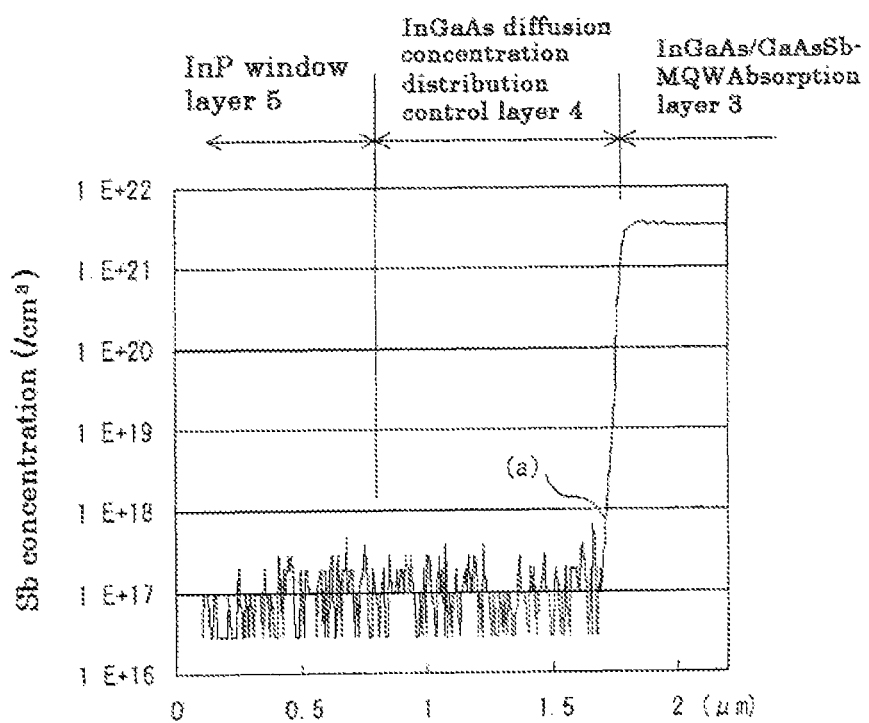
FIG. 16 is a graph showing a concentration distribution of Sb in the depth direction of Invention Example A1 in Example 2.
Figure 17:
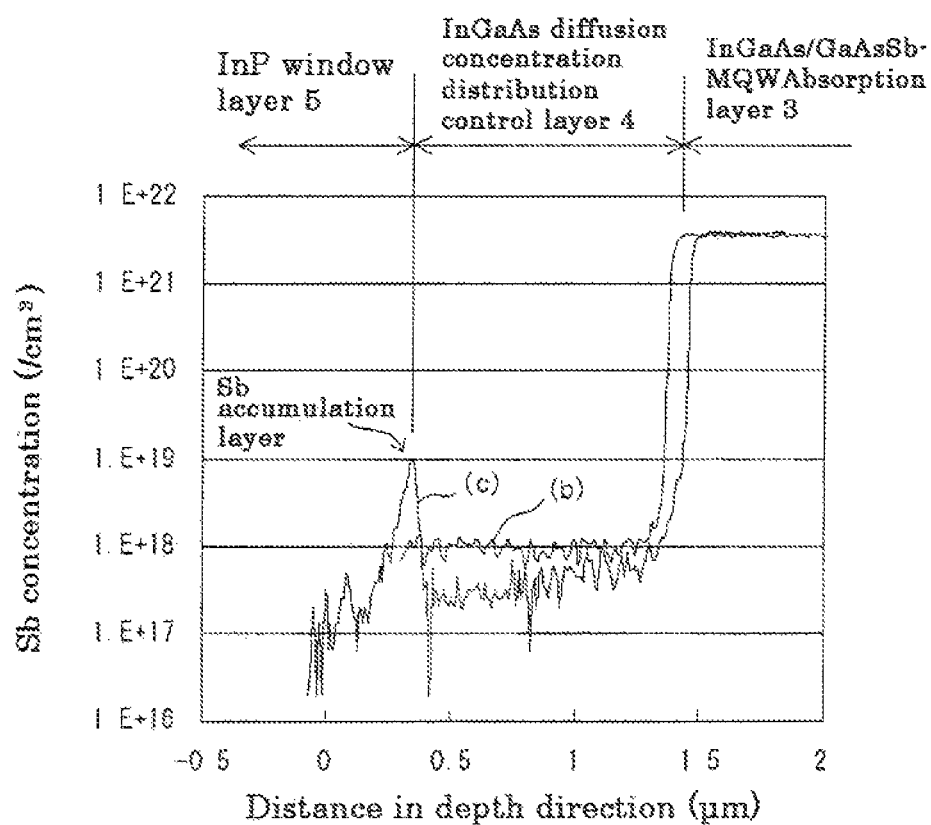
FIG. 17 is a graph showing a concentration distribution of Sb in the depth direction of Comparative Example B1 in Example 2.

FIG. 16 shows the measurement results of Invention Example A1, and FIG. 17 shows the measurement results of Comparative Example B1. In Comparative Example B1, in a state in which the InP window layer is not stacked, a high Sb concentration exceeding $5 \times 10^{17}$/cm$^3$ and reaching $1 \times 10^{18}$/cm$^3$ was shown in the InGaAs diffusion concentration distribution control layer 4. After the formation of the InP window layer 5 by the MOVPE method, an Sb-rich layer having a peak value reaching $1 \times 10^{19}$/cm$^3$ appeared at the boundary between the InP window layer 5 and the InGaAs diffusion concentration distribution control layer 4. This Sb-rich layer is produced as a result of accumulation of Sb attracted from the InGaAs diffusion concentration distribution control layer 4. It seems that Sb is also attracted from the multiquantum well structure 3. Furthermore, it should be particularly emphasized that the crystal surface of the InP window layer 5 was roughened in Comparative Example B1. According to an examination by scanning electron microscopy etc., a large number of holes are formed on the surface of the InGaAs diffusion concentration distribution control layer 4. It is believed that these holes correspond to positions from which Sb has been removed. At the positions where Sb has been removed to form holes, leakage of a current occurs and the dark current increases.

In contrast, as shown in FIG. 16, in Invention Example A1, the Sb concentration is about $1 \times 10^{17}$/cm$^3$ in both the InGaAs diffusion concentration distribution control layer 4 and the InP window layer 5, and the surface accumulation of Sb is prevented. The surface 5a of the InP window layer 5 was smooth and was not roughened. According to the method described in Embodiment 2, it is possible to prevent an increase in the dark current due to the surface accumulation of Sb or the removal of Sb.

EXAMPLE 3

Example 3—Hybrid Growth Method

It was verified that, by using the hybrid growth method, the multiquantum well structure 3 maintains a good crystal quality, the InP window layer 5 composed of good crystals is obtained, and a heterogeneous component accumulation layer due to the outside air is formed on a surface 4a of the diffusion concentration distribution control layer 4. Specimens used are Invention Examples A2 and A3 described below.

Invention Example A2

An epitaxial laminate shown in the top view of FIG. 11 was formed on a S-doped (001) InP substrate 1 by an MBE method. The epitaxial laminate includes the InP substrate 1, a buffer layer 2, an absorption layer 3, and a diffusion concentration distribution control layer 4. A Si-doped $In_xGa_{1-x}As$ was used as the buffer layer 2. The buffer layer 2 had a thickness of 0.15 μm, and was formed while supplying Si during the growth so as to have an n-conductivity type of a carrier concentration of $5\times10^{16}/cm^3$. The indium (In) proportion x of the buffer layer 2 was 0.531. The absorption layer 3 had a type II quantum well structure including pairs of $In_xGa_{1-x}As/GaAs_{1-y}Sb_y$. Each of the $In_xGa_{1-x}As$ layer and the $GaAs_{1-y}Sb_y$ layer had a thickness of 5 nm, and the thickness of each pair was 10 nm. The number of pairs was 250. The In proportion x of $In_xGa_{1-x}As$ of the multi quantum well was 0.531, and the Sb proportion y of $GaAs_{1-y}Sb_y$ thereof was 0.487. A non-doped $In_zGa_{1-z}As$ diffusion concentration distribution control layer 4 having a thickness of 1 μm was grown on this absorption layer 3 having the multiquantum well structure. The In proportion z was 0.531. From the step of growing the buffer layer 2 to the step of growing the diffusion concentration distribution control layer 4 were performed by the MBE method, and the substrate 60, which was an intermediate product, was then taken out from an MBE apparatus to the outside air and was charged in a MOVPE apparatus. A Si-doped InP window layer 5 was grown in the MOVPE apparatus. TMI and TBP were used as materials, and hydrogen was used as a carrier gas. A substrate temperature Tg was 480° C. The thickness of the InP window layer 5 was 0.8 μm, and the Si doping density was $3\times10^{15}/cm^3$.

Comparative Example B2

An epitaxial laminate having the same structure as that of Invention Example A2 was fabricated. However, when the InP window layer 5 was deposited by the MOVPE method, $PH_3$ and TMI were used as materials. The substrate temperature during the MOVPE deposition was 620° C. Comparative Example B2 differs from Invention Example A2 in that the decomposition temperature of phosphine was higher than that of TBP.

Comparative Example B2 was evaluated by measuring the impurity distribution in the depth direction by SIMS. In addition, the state of the absorption layer 3 having the multiquantum well structure can be determined on the basis of the substrate temperature during the MOVPE deposition from the results of past heating experiments. That is, according to the results of the deposition at 620° C., the surface 5a of the InP window layer 5 is rough, and it is difficult to maintain a good crystal quality of the absorption layer and the like.

The results of Invention Example A2 showed that deposition of InP can be performed at a low temperature of 480° C. by using TBP as a phosphorus source. As a result, it was confirmed that degradation of the quality of the type II quantum well structure composed of InGaAs(N)/GaAsSb can be prevented by the hybrid growth method while overcoming a problem such as the attachment of a phosphorus compound to inner walls of a growth chamber.

Figure 18:
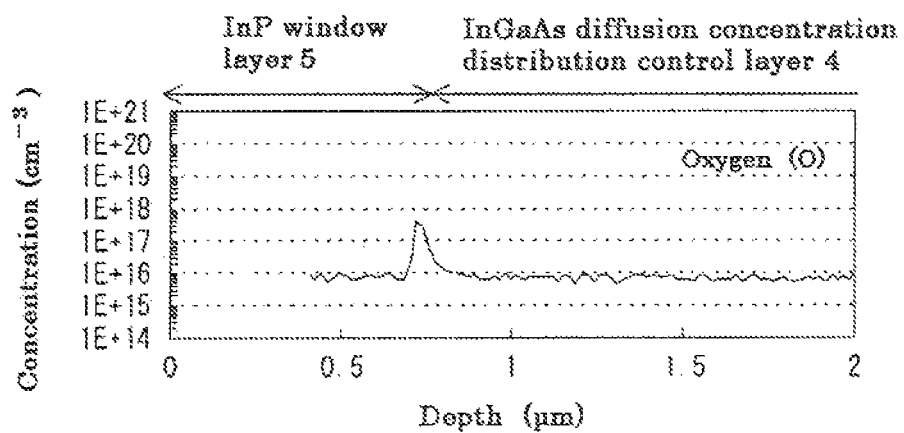
FIG. 18 is a graph showing a concentration distribution of oxygen in the depth direction of Invention Example A3 in Example 3.
Figure 19:
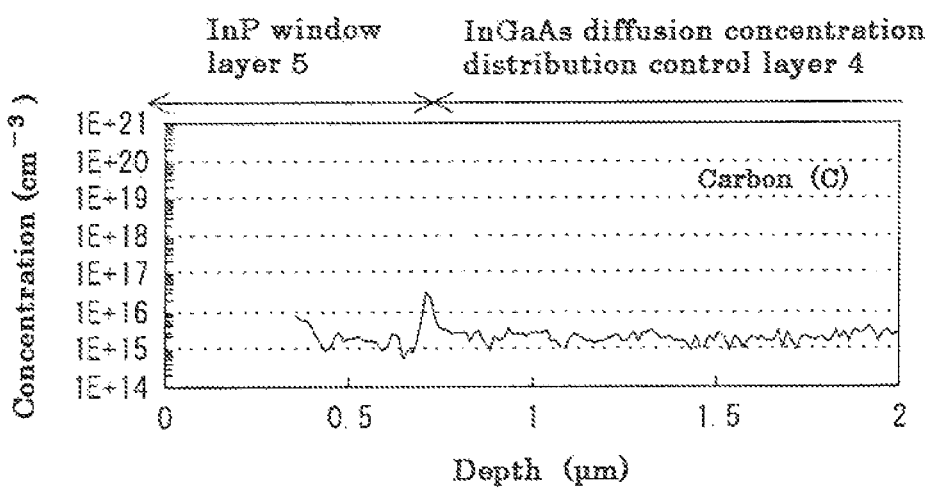
FIG. 19 is a graph showing a concentration distribution of carbon in the depth direction of Invention Example A3 in Example 3.
Figure 20:
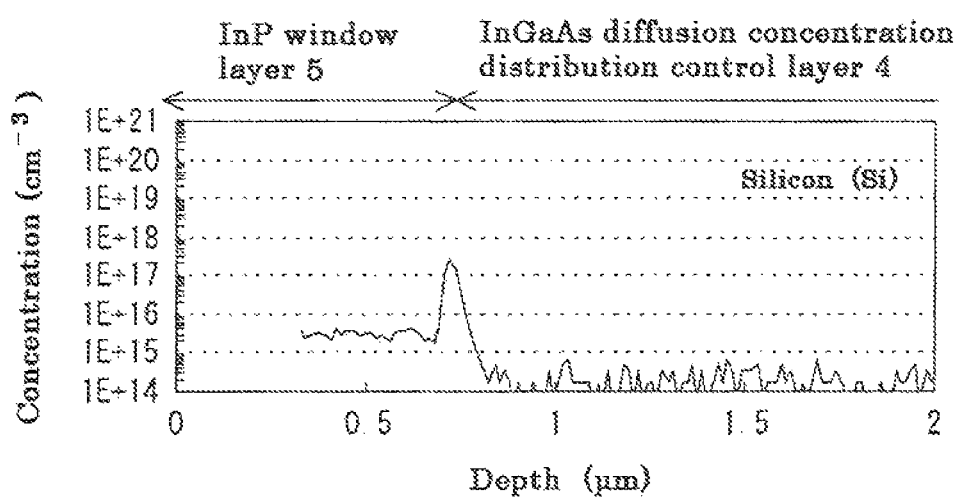
FIG. 20 is a graph showing a concentration distribution of silicon in the depth direction of Invention Example A3 in Example 3.

In this hybrid growth method, a trace characteristic to this growth method is left in the resulting laminate. An enriched layer of oxygen (O) (FIG. 18) having a peak value of $4\times10^{17}/cm^3$, carbon (C) (FIG. 19) having a peak value of $2.8\times10^{16}/cm^3$, and silicon (Si) (FIG. 20) having a peak value of $2.7\times10^{17}/cm^3$ was detected at the interface between the InP window layer 5 and the InGaAs diffusion concentration distribution control layer 4. This is because impurities were attached to the surface of crystals when the substrate was taken out to the outside air after the InGaAs diffusion concentration distribution control layer 4 was grown with the MBE apparatus. This is a feature that specifies the use of the hybrid growth method.

With Regard to Other Embodiments

In the above embodiments, a light-receiving element or light-receiving element array including a diffusion concentration distribution control layer has been described. However, in the most broad sense, even if a light-receiving element does not include the diffusion concentration distribution control layer, it is sufficient that the concentration of an impurity in a multiquantum well structure is $5\times10^{16}$ cm$^{-3}$ or less, and the impurity is introduced by selective diffusion.

Embodiments and Examples of the present invention have been described above. The embodiments and Examples of the present invention disclosed above are only illustrative, and the scope of the present invention is not limited to these embodiments of the invention. It is to be understood that the scope of the present invention is defined by the description of Claims and includes equivalence of the description in Claims and all modifications within the scope of Claims.

INDUSTRIAL APPLICABILITY

According to the present invention, it is possible to obtain a light-receiving element which has sensitivity in the near-infrared region and in which a good crystal quality is easily obtained, a one-dimensional or two-dimensional array of the light-receiving elements is easily formed with a high accuracy, and a dark current can be reduced; and a light-receiving element array in which the light-receiving elements are arranged.

What is claimed is:

1. A light-receiving element comprising a group III-V compound semiconductor stacked structure including an absorption layer having a pn-junction therein, the group III-V compound semiconductor stacked structure being formed on a group III-V compound semiconductor substrate,
    wherein the absorption layer has a multiquantum well structure composed of group III-V compound semiconductors, the pn-junction is formed by selectively diffusing an impurity element into the absorption layer,
    a diffusion concentration distribution control layer composed of III-V group semiconductor is disposed in contact with the absorption layer on a side of the absorption layer opposite the side adjacent to the group III-V compound semiconductor substrate,
    the bandgap energy of the diffusion concentration distribution control layer is smaller than that of the group III-V compound semiconductor substrate,
    the concentration of the impurity element selectively diffused in the diffusion concentration distribution control layer is decreased to be $5\times10^{16}/cm^3$ or less toward the absorption layer.

2. The light-receiving element according to claim 1, wherein the concentration of the impurity element in the region located adjacent to a surface of the diffusion concentration distribution control layer opposite the surface in contact with the absorption layer being $1\times10^{18}/cm^3$ or more.

3. The light-receiving element according to claim 1, wherein a pile-up of selectively diffused impurity element presents at the boundary between the diffusion concentration distribution control layer and the absorption layer.

4. The light-receiving element according to claim 1, wherein the diffusion concentration distribution control layer is composed of IndaAs.

5. The light-receiving element according to claim 1, wherein an InP window layer is provided on the diffusion concentration distribution control layer, and a heterogeneous component pile-up layer in which at least one of oxygen (O), carbon (C), hydrogen (H), and silicon (Si) is piled up is present at the boundary between the diffusion concentration distribution control layer and the InP window layer.

6. A light-receiving element array comprising a plurality of the light-receiving elements according to claim 1, wherein the light-receiving elements include the semiconductor stacked structure in common, the impurity element is introduced by selective diffusion in the absorption layer for each of the light-receiving elements, and the light-receiving elements are arranged one-dimensionally or two-dimensionally.

7. The light-receiving element according to claim 1, wherein the multiquantum well structure is a type II quantum well structure.

8. The light-receiving element according to claim 7, wherein the group III-V compound semiconductor stacked structure is formed on an InP substrate, the absorption layer has an InGaAs/GaAsSb multiquantum well structure or a GaInNAs/GaAsSb multiquantum well structure, and the impurity element is Zn.

9. The light-receiving element according to claim 8, wherein an InP window layer is provided on the diffusion concentration distribution control layer, and there is no pile-up of Sb at the boundary between the diffusion concentration distribution control layer and the InP window layer.

10. The light-receiving element according to claim 8, wherein an InP window layer is provided on the diffusion concentration distribution control layer, and a Sb concentration is $1\times10^{18}/cm^3$ or less in the diffusion concentration distribution control layer and the InP window layer.

11. A method for producing a light-receiving element having a group III-V compound semiconductor stacked structure that includes an absorption layer having a pn-junction therein, the method comprising the steps of:
forming the absorption layer on an InP substrate so as to have a multiquantum well structure;
forming, on the absorption layer, a diffusion concentration distribution control layer having a bandgap energy smaller than the bandgap energy corresponding to that of InP in order to control the concentration of an impurity element in the absorption layer to be low; and
selectively diffusing the impurity element into the absorption layer through the diffusion concentration distribution control layer to decrease the impurity element in the diffusion concentration distribution control layer to be $5\times10^{16}/cm^3$ or less toward the absorption layer.

12. The method for producing a light-receiving element according to claim 11, wherein, after the absorption layer is formed on the InP substrate so as to have a multiquantum well structure including at least one layer containing Sb and before the diffusion concentration distribution control layer is formed, the stacked structure is cooled to 300° C. or lower.

13. The method for producing a light-receiving element according to claim 12, wherein, after the absorption layer is formed on the InP substrate and before the cooling is conducted, the stacked structure is held at a temperature 10° C. to 50° C. higher than a deposition temperature of the absorption layer for 10 minutes or more and 30 minutes or less, and the cooling or the moving and cooling are then performed.

14. The method for producing a light-receiving element according to claim 11, wherein, after the absorption layer is formed on the InP substrate and before the diffusion concentration distribution control layer is formed, the stacked structure is moved from a growth chamber in which the absorption layer has been formed to a waiting chamber connected to the growth chamber to cool the stacked structure to 300° C. or lower.

15. The method for producing a light-receiving element according to claim 11, wherein the absorption layer and the diffusion concentration distribution control layer are deposited on the InP substrate at 550° C. or lower by a molecular beam epitaxy (MBE) method, and an InP window layer is then deposited at 550° C. or lower by an all-metalorganic vapor phase epitaxy (all-MOVPE) method on the diffusion concentration distribution control layer.

16. The method for producing a light-receiving element according to claim 15, wherein, after the absorption layer and the diffusion concentration distribution control layer are deposited on the InP substrate by the MBE method, the stacked structure is exposed to the atmosphere and is then charged in a growth chamber in MOVPE to deposit the InP window layer.

17. A method for producing a light-receiving element array, wherein, in order to produce a light-receiving element array in which a plurality of the light-receiving elements are arranged, the group III-V compound semiconductor stacked structure is used in common and the method for producing a light-receiving element according to any one of claims 11 to 16 is applied to the plurality of light-receiving elements, in the step of selective diffusion of the impurity element, the impurity element is selectively diffused into the absorption layer for each light-receiving element through the diffusion concentration distribution control layer so that the light-receiving elements are separated from each other to decrease the impurity element in the diffusion concentration distribution control layer to be $5\times10^{16}/cm^3$ or less toward the absorption layer.

* * * * *

UNITED STATES PATENT AND TRADEMARK OFFICE
CERTIFICATE OF CORRECTION

| | | |
|---|---|---|
| PATENT NO. | : 8,729,527 B2 | Page 1 of 1 |
| APPLICATION NO. | : 13/451031 | |
| DATED | : May 20, 2014 | |
| INVENTOR(S) | : Yasuhiro Iguchi et al. | |

It is certified that error appears in the above-identified patent and that said Letters Patent is hereby corrected as shown below:

On the title page, item (75) Inventors: Yasuhiro Iguchi, delete "Osaki" and insert -- Osaka --.

In the Claims:

Column 25, line 7, claim 4, delete "IndaAs" and insert -- InGaAs --.

Column 26, line 8, claim 12, delete "300° C." and insert -- 300°C --.

Column 26, line 12, claim 13, delete "10° C." and insert -- 10°C --.

Column 26, line 13, claim 13, delete "50° C." and insert -- 50°C --.

Column 26, line 22, claim 14, delete "300° C." and insert -- 300°C --.

Column 26, line 27, claim 15, delete "550° C." and insert -- 550°C --.

Column 26, line 29, claim 15, delete "550° C." and insert -- 550°C --.

Signed and Sealed this
Twenty-third Day of September, 2014

Michelle K. Lee
*Deputy Director of the United States Patent and Trademark Office*